(12) United States Patent
Xu et al.

(10) Patent No.: US 8,345,794 B2
(45) Date of Patent: Jan. 1, 2013

(54) ENCODED CONTROL CHANNEL INFORMATION INTERLEAVING

(75) Inventors: Hao Xu, San Diego, CA (US); Durga Prasad Malladi, San Diego, CA (US); Peter Gaal, San Diego, CA (US); Zhifei Fan, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 830 days.

(21) Appl. No.: 12/431,410

(22) Filed: Apr. 28, 2009

(65) Prior Publication Data

US 2009/0296850 A1 Dec. 3, 2009

Related U.S. Application Data

(60) Provisional application No. 61/048,923, filed on Apr. 29, 2008.

(51) Int. Cl.
*H04K 1/02* (2006.01)
*H03M 13/00* (2006.01)
(52) U.S. Cl. .................. 375/296; 714/752; 714/761
(58) Field of Classification Search .................. 375/296, 375/278, 284, 285; 714/752, 761, 762, 782, 714/783, 784, 790
See application file for complete search history.

(56) References Cited

U.S. PATENT DOCUMENTS

| | | | |
|---|---|---|---|
| 6,442,728 B1 | 8/2002 | Cui et al. | |
| 6,851,085 B2* | 2/2005 | Kim et al. | 714/779 |
| 6,859,545 B1* | 2/2005 | Wu | 382/100 |
| 7,933,606 B2* | 4/2011 | Frederiksen et al. | 455/450 |
| 2004/0110473 A1* | 6/2004 | Rudolf et al. | 455/69 |
| 2007/0077886 A1* | 4/2007 | Lundby et al. | 455/39 |
| 2007/0140377 A1* | 6/2007 | Murakami et al. | 375/299 |
| 2007/0171864 A1* | 7/2007 | Zhang et al. | 370/329 |
| 2008/0298480 A1* | 12/2008 | Li et al. | 375/260 |

FOREIGN PATENT DOCUMENTS

| | | |
|---|---|---|
| EP | 1608075 A2 | 12/2005 |
| JP | 2000353965 | 12/2000 |
| JP | 2002535867 A | 10/2002 |
| JP | 2004040226 A | 2/2004 |
| JP | 2008503110 A | 1/2008 |

(Continued)

OTHER PUBLICATIONS

International Search Report & Written Opinion—PCT/US2009/042150, International Search Authority—European Patent Office—Sep. 16, 2009.

(Continued)

*Primary Examiner* — Kevin Kim

(57) ABSTRACT

Systems and methodologies are described that facilitate interleaving encoded control channel information for transmission over an uplink channel. The encoded control channel information, for example, can include encoded Channel Quality Indicator (CQI) information, encoded Precoding Matrix Indicator (PMI) information, and/or Rank Indicator (RI) information. CQI information, PMI information, and/or RI information can be encoded at an access terminal, for instance, by applying a punctured Reed Muller block code to generate a sequence of encoded bits. The encoded bits can be interleaved to reorder the sequence utilizing one or more interleaving approaches. Examples of interleaving approaches that can be leveraged include prime number based interleaving, generalized bit reversal interleaving, column-row interleaving with column bit reversal, and/or M-sequence based interleaving. Further, the reordered sequence of encoded bits can be transmitted to a base station over an uplink channel.

19 Claims, 13 Drawing Sheets

FOREIGN PATENT DOCUMENTS

JP        2008507935 A    3/2008
WO     WO2006069392       6/2006

OTHER PUBLICATIONS

Qualcomm Europe: "Interleaver for PUCCH" 3GPP Draft; RI-081501, 3rd Generation Partnership Project (3GPP), Mobile Competence Centre ; 650, Route Des Lucioles ; F-06921 Sophia-Antipolis Cedex ; France, vol. RAN WGI, no. Shenzhen, China; 20080327, Mar. 27, 2008, XP050109917 [retrieved on Mar. 27, 2008] p. 1, paragraphs 1,2; table 1.
[retrieved on Mar. 27, 2008]p. 1, paragraphs 1,2; table 1.

* cited by examiner

FIG. 7

| | K | K1 | K2 | K3 |
|---|---|---|---|---|
| | 0 | 0 | 0 | 0 |
| | 1 | 7 | 4 | 2 |
| | 2 | 14 | 8 | 19 |
| | 3 | 1 | 12 | 16 |
| | 4 | 8 | 16 | 8 |
| | 5 | 15 | 2 | 4 |
| | 6 | 2 | 6 | 9 |
| | 7 | 9 | 10 | 17 |
| | 8 | 16 | 14 | 1 |
| | 9 | 3 | 18 | 3 |
| | 10 | 10 | 1 | 7 |
| | 11 | 17 | 5 | 14 |
| | 12 | 4 | 9 | 13 |
| | 13 | 11 | 13 | 15 |
| | 14 | 18 | 17 | 5 |
| | 15 | 5 | 3 | 10 |
| | 16 | 12 | 7 | 6 |
| | 17 | 19 | 11 | 12 |
| | 18 | 6 | 15 | 11 |
| | 19 | 13 | 19 | 18 |

700

ENCODED CONTROL CHANNEL INFORMATION INTERLEAVING

CROSS-REFERENCE TO RELATED APPLICATIONS

This application claims the benefit of U.S. Provisional Patent Application Ser. No. 61/048,923 entitled "A METHOD AND APPARATUS FOR INTERLEAVING LTE CQI CHANNEL" which was filed Apr. 29, 2008. The entirety of the aforementioned application is herein incorporated by reference.

BACKGROUND

I. Field

The following description relates generally to wireless communications, and more particularly to employing interleaving upon encoded control channel information in a wireless communication system.

II. Background

Wireless communication systems are widely deployed to provide various types of communication; for instance, voice and/or data can be provided via such wireless communication systems. A typical wireless communication system, or network, can provide multiple users access to one or more shared resources (e.g., bandwidth, transmit power, . . . ). For instance, a system can use a variety of multiple access techniques such as Frequency Division Multiplexing (FDM), Time Division Multiplexing (TDM), Code Division Multiplexing (CDM), Orthogonal Frequency Division Multiplexing (OFDM), and others.

Generally, wireless multiple-access communication systems can simultaneously support communication for multiple access terminals. Each access terminal can communicate with one or more base stations via transmissions on forward and reverse links. The forward link (or downlink) refers to the communication link from base stations to access terminals, and the reverse link (or uplink) refers to the communication link from access terminals to base stations. This communication link can be established via a single-in-single-out, multiple-in-single-out or a multiple-in-multiple-out (MIMO) system.

MIMO systems commonly employ multiple ($N_T$) transmit antennas and multiple ($N_R$) receive antennas for data transmission. A MIMO channel formed by the $N_T$ transmit and $N_R$ receive antennas can be decomposed into Ns independent channels, which can be referred to as spatial channels, where $N_S \leq \{N_T, N_R\}$. Each of the $N_S$ independent channels corresponds to a dimension. Moreover, MIMO systems can provide improved performance (e.g., increased spectral efficiency, higher throughput and/or greater reliability) if the additional dimensionalities created by the multiple transmit and receive antennas are utilized.

MIMO systems can support various duplexing techniques to divide forward and reverse link communications over a common physical medium. For instance, frequency division duplex (FDD) systems can utilize disparate frequency regions for forward and reverse link communications. Further, in time division duplex (TDD) systems, forward and reverse link communications can employ a common frequency region so that the reciprocity principle allows estimation of the forward link channel from reverse link channel.

Wireless communication systems oftentimes employ one or more base stations that provide a coverage area. A typical base station can transmit multiple data streams for broadcast, multicast and/or unicast services, wherein a data stream may be a stream of data that can be of independent reception interest to an access terminal. An access terminal within the coverage area of such base station can be employed to receive one, more than one, or all the data streams carried by the composite stream. Likewise, an access terminal can transmit data to the base station or another access terminal.

Conventional wireless communication techniques oftentimes monitor downlink channel conditions at an access terminal, and send feedback related to the monitored channel conditions from the access terminal to a corresponding base station. The feedback corresponding to the monitored channel conditions can be a Channel Quality Indicator (CQI), which can be transmitted by the access terminal to the base station over an uplink channel. Common approaches, however, typically fail to interleave encoded CQI information sent over the uplink channel, which can cause increased error rates for time varying channels.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

In accordance with one or more embodiments and corresponding disclosure thereof, various aspects are described in connection with facilitating interleaving of encoded control channel information for transmission over an uplink channel. The encoded control channel information, for example, can include encoded Channel Quality Indicator (CQI) information, encoded Precoding Matrix Indicator (PMI) information, and/or Rank Indicator (RI) information. CQI information, PMI information, and/or RI information can be encoded at an access terminal, for instance, by applying a punctured Reed Muller block code to generate a sequence of encoded bits. The encoded bits can be interleaved to reorder the sequence utilizing one or more interleaving approaches. Examples of interleaving approaches that can be leveraged include prime number based interleaving, generalized bit reversal interleaving, column-row interleaving with column bit reversal, and/or M-sequence based interleaving. Further, the reordered sequence of encoded bits can be transmitted to a base station over an uplink channel.

According to related aspects, a method that facilitates sending Channel Quality Indicator (CQI) information in a wireless communication environment is described herein. The method can include encoding CQI information to yield a sequence of coded CQI bits with a particular order. Further, the method can include interleaving the coded CQI bits to reorder the sequence of coded CQI bits. Moreover, the method can include transmitting the reordered sequence of coded CQI bits to a base station via an uplink channel.

Another aspect relates to a wireless communications apparatus. The wireless communications apparatus can include a memory that retains instructions related to applying a punctured Reed Muller block code to encode a Channel Quality Indicator (CQI) report to generate an uninterleaved sequence that includes M coded CQI bits in an inputted order, wherein M is an integer pertaining to a total number of coded CQI bits, permuting the M coded CQI bits to yield an interleaved sequence that includes the M coded CQI bits in an outputted order, and sending the interleaved sequence that includes the M coded CQI bits in the outputted order to a base station over an uplink channel. Further, the wireless communications apparatus can include a processor, coupled to the memory, configured to execute the instructions retained in the memory.

Yet another aspect relates to a wireless communications apparatus that enables sending Channel Quality Indicator (CQI) information in a wireless communication environment. The wireless communications apparatus can include means for generating a sequence of coded CQI bits. Further, the wireless communications apparatus can include means for permuting an arrangement of the coded CQI bits to yield an interleaved sequence of coded CQI bits. Moreover, the wireless communications apparatus can include means for sending the interleaved sequence of coded CQI bits over an uplink channel to a base station.

Still another aspect relates to a computer program product that can comprise a computer-readable medium. The computer-readable medium can include code for applying a punctured Reed Muller block code to encode control channel information to generate an uninterleaved sequence that includes M coded bits in an inputted order, wherein M is an integer pertaining to a total number of coded bits. Moreover, the computer-readable medium can comprise code for permuting the M coded bits to yield an interleaved sequence that includes the M coded bits in an outputted order. Further, the computer-readable medium can include code for transmitting the interleaved sequence that includes the M coded bits in the outputted order to a base station over an uplink channel.

In accordance with another aspect, a wireless communications apparatus can include a processor, wherein the processor can be configured to encode Channel Quality Indictor (CQI) information to yield a sequence of coded CQI bits with a particular order. Moreover, the processor can be configured to interleave the coded CQI bits to reorder the sequence of coded CQI bits. Further, the processor can be configured to transmit the reordered sequence of coded CQI bits to a base station via an uplink channel.

Toward the accomplishment of the foregoing and related ends, the one or more embodiments comprise the features hereinafter fully described and particularly pointed out in the claims. The following description and the annexed drawings set forth herein detail certain illustrative aspects of the one or more embodiments. These aspects are indicative, however, of but a few of the various ways in which the principles of various embodiments can be employed and the described embodiments are intended to include all such aspects and their equivalents.

BRIEF DESCRIPTION OF THE DRAWINGS

FIG. 7 is an illustration of an example table that includes a sequence of input positions, K, as well as possible output sequences that can be yielded by CQI interleaving approaches described herein.

DETAILED DESCRIPTION

Figure 1:
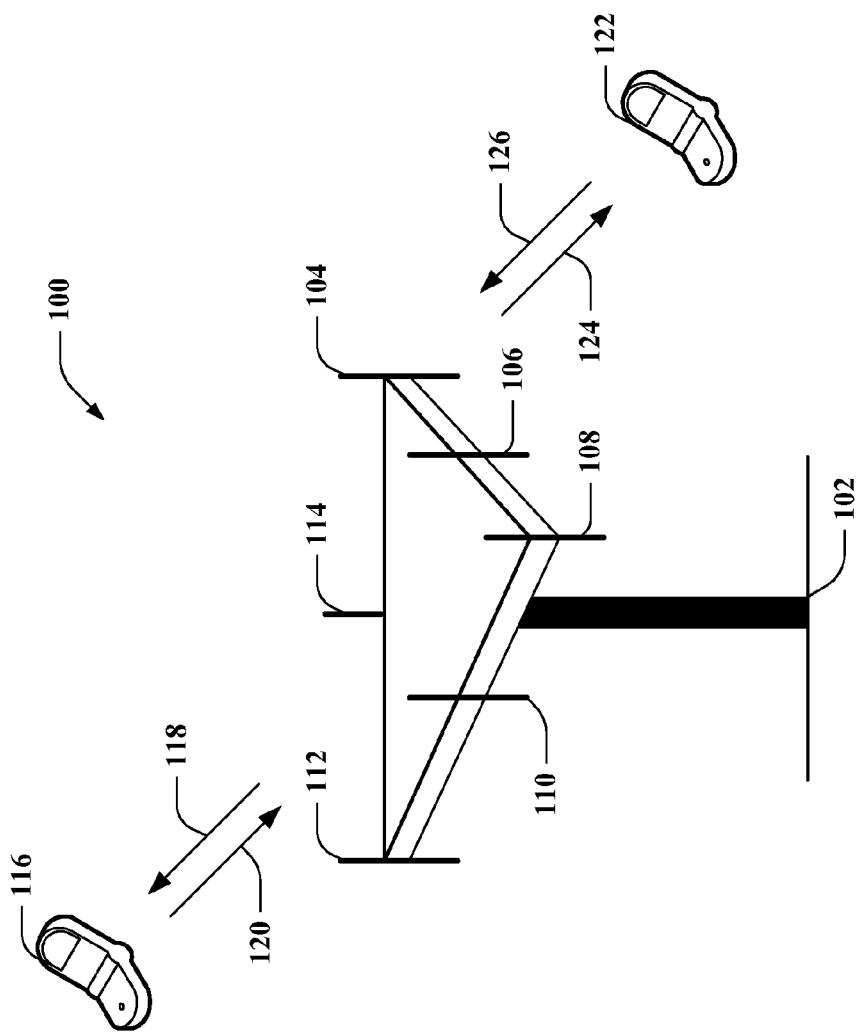
FIG. 1 is an illustration of a wireless communication system in accordance with various aspects set forth herein.

Various embodiments are now described with reference to the drawings, wherein like reference numerals are used to refer to like elements throughout. In the following description, for purposes of explanation, numerous specific details are set forth in order to provide a thorough understanding of one or more embodiments. It may be evident, however, that such embodiment(s) may be practiced without these specific details. In other instances, well-known structures and devices are shown in block diagram form in order to facilitate describing one or more embodiments.

As used in this application, the terms "component," "module," "system," and the like are intended to refer to a computer-related entity, either hardware, firmware, a combination of hardware and software, software, or software in execution. For example, a component can be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component can be localized on one computer and/or distributed between two or more computers. In addition, these components can execute from various computer readable media having various data structures stored thereon. The components can communicate by way of local and/or remote processes such as in accordance with a signal having one or more data packets (e.g., data from one component interacting with another component in a local system, distributed system, and/or across a network such as the Internet with other systems by way of the signal).

The techniques described herein can be used for various wireless communication systems such as code division multiple access (CDMA), time division multiple access (TDMA), frequency division multiple access (FDMA), orthogonal frequency division multiple access (OFDMA), single carrier-frequency division multiple access (SC-FDMA) and other systems. The terms "system" and "network" are often used interchangeably. A CDMA system can implement a radio technology such as Universal Terrestrial Radio Access (UTRA), CDMA2000, etc. UTRA includes Wideband-CDMA (W-CDMA) and other variants of CDMA. CDMA2000 covers IS-2000, IS-95 and IS-856 standards. A TDMA system can implement a radio technology such as Global System for Mobile Communications (GSM). An OFDMA system can implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM, etc. UTRA and E-UTRA are part of Universal Mobile Telecommunication System (UMTS). 3GPP Long Term Evolution (LTE) is an upcoming release of UMTS that uses E-UTRA, which employs OFDMA on the downlink and SC-FDMA on the uplink. UTRA, E-UTRA, UMTS, LTE and GSM are described in documents from an organization named "3rd Generation Partnership Project" (3GPP). Additionally, CDMA2000 and UMB are described in documents from an organization named "3rd Generation Partnership Project 2" (3GPP2). Further, such wireless communication systems can additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA) utilizes single carrier modulation and frequency domain equalization. SC-FDMA has similar performance and essentially the same overall complexity as those of an OFDMA system. A SC-FDMA signal has lower peak-to-average power ratio (PAPR) because of its inherent single carrier structure. SC-FDMA can be used, for instance, in uplink communications where lower PAPR greatly benefits access terminals in terms of transmit power efficiency. Accordingly, SC-FDMA can be implemented as an uplink multiple access scheme in 3GPP Long Term Evolution (LTE) or Evolved UTRA.

Furthermore, various embodiments are described herein in connection with an access terminal. An access terminal can also be called a system, subscriber unit, subscriber station, mobile station, mobile, remote station, remote terminal, mobile device, user terminal, terminal, wireless communication device, user agent, user device, or user equipment (UE). An access terminal can be a cellular telephone, a cordless telephone, a Session Initiation Protocol (SIP) phone, a wireless local loop (WLL) station, a personal digital assistant (PDA), a handheld device having wireless connection capability, computing device, or other processing device connected to a wireless modem. Moreover, various embodiments are described herein in connection with a base station. A base station can be utilized for communicating with access terminal(s) and can also be referred to as an access point, Node B, Evolved Node B (eNodeB, eNB) or some other terminology.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Various aspects or features described herein can be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data.

Referring now to FIG. 1, a wireless communication system 100 is illustrated in accordance with various embodiments presented herein. System 100 comprises a base station 102 that can include multiple antenna groups. For example, one antenna group can include antennas 104 and 106, another group can comprise antennas 108 and 110, and an additional group can include antennas 112 and 114. Two antennas are illustrated for each antenna group; however, more or fewer antennas can be utilized for each group. Base station 102 can additionally include a transmitter chain and a receiver chain, each of which can in turn comprise a plurality of components associated with signal transmission and reception (e.g., processors, modulators, multiplexers, demodulators, demultiplexers, antennas, etc.), as will be appreciated by one skilled in the art.

Base station 102 can communicate with one or more access terminals such as access terminal 116 and access terminal 122; however, it is to be appreciated that base station 102 can communicate with substantially any number of access terminals similar to access terminals 116 and 122. Access terminals 116 and 122 can be, for example, cellular phones, smart phones, laptops, handheld communication devices, handheld computing devices, satellite radios, global positioning systems, PDAs, and/or any other suitable device for communicating over wireless communication system 100. As depicted, access terminal 116 is in communication with antennas 112 and 114, where antennas 112 and 114 transmit information to access terminal 116 over a forward link 118 and receive information from access terminal 116 over a reverse link 120. Moreover, access terminal 122 is in communication with antennas 104 and 106, where antennas 104 and 106 transmit information to access terminal 122 over a forward link 124 and receive information from access terminal 122 over a reverse link 126. In a frequency division duplex (FDD) system, forward link 118 can utilize a different frequency band than that used by reverse link 120, and forward link 124 can employ a different frequency band than that employed by reverse link 126, for example. Further, in a time division duplex (TDD) system, forward link 118 and reverse link 120 can utilize a common frequency band and forward link 124 and reverse link 126 can utilize a common frequency band.

Each group of antennas and/or the area in which they are designated to communicate can be referred to as a sector of base station 102. For example, antenna groups can be designed to communicate to access terminals in a sector of the areas covered by base station 102. In communication over forward links 118 and 124, the transmitting antennas of base station 102 can utilize beamforming to improve signal-to-noise ratio of forward links 118 and 124 for access terminals 116 and 122. Also, while base station 102 utilizes beamforming to transmit to access terminals 116 and 122 scattered randomly through an associated coverage, access terminals in neighboring cells can be subject to less interference as compared to a base station transmitting through a single antenna to all its access terminals.

System 100 can employ a channel interleaving scheme that can be applied to an uplink channel. The channel interleaving scheme can be utilized in connection with a normal Cyclic Prefix (CP) or an extended CP. Access terminals 116, 122 can evaluate downlink channel conditions and can generate Channel Quality Indicator (CQI) information (e.g., CQI reports, . . . ) based upon the evaluation. The CQI information respectively yielded by access terminals 116, 122 can be encoded. The CQI information can be encoded using a block code such as, for instance, a Reed-Muller (RM) code. The encoded CQI information can thereafter be interleaved by access terminals 116, 122 and sent to base station 102 via an uplink channel. In contrast, conventional techniques oftentimes fail to interleave encoded CQI information for transmission over the uplink channel, which can lead to increased error rates. For example, error rates associated with conventional approaches can be significantly greater when the encoded CQI information is sent via a time varying channel without being interleaved.

Utilization of the channel interleaving schemes in connection with the uplink channel described herein can yield decreased error rates as compared to common techniques under various conditions. For instance, diminished error rates can result for access terminals 116, 122 when moving at various speeds or stationary. Moreover, decreased error rates can be yielded for differing payload sizes when employing the channel interleaving schemes set forth herein.

Figure 2:
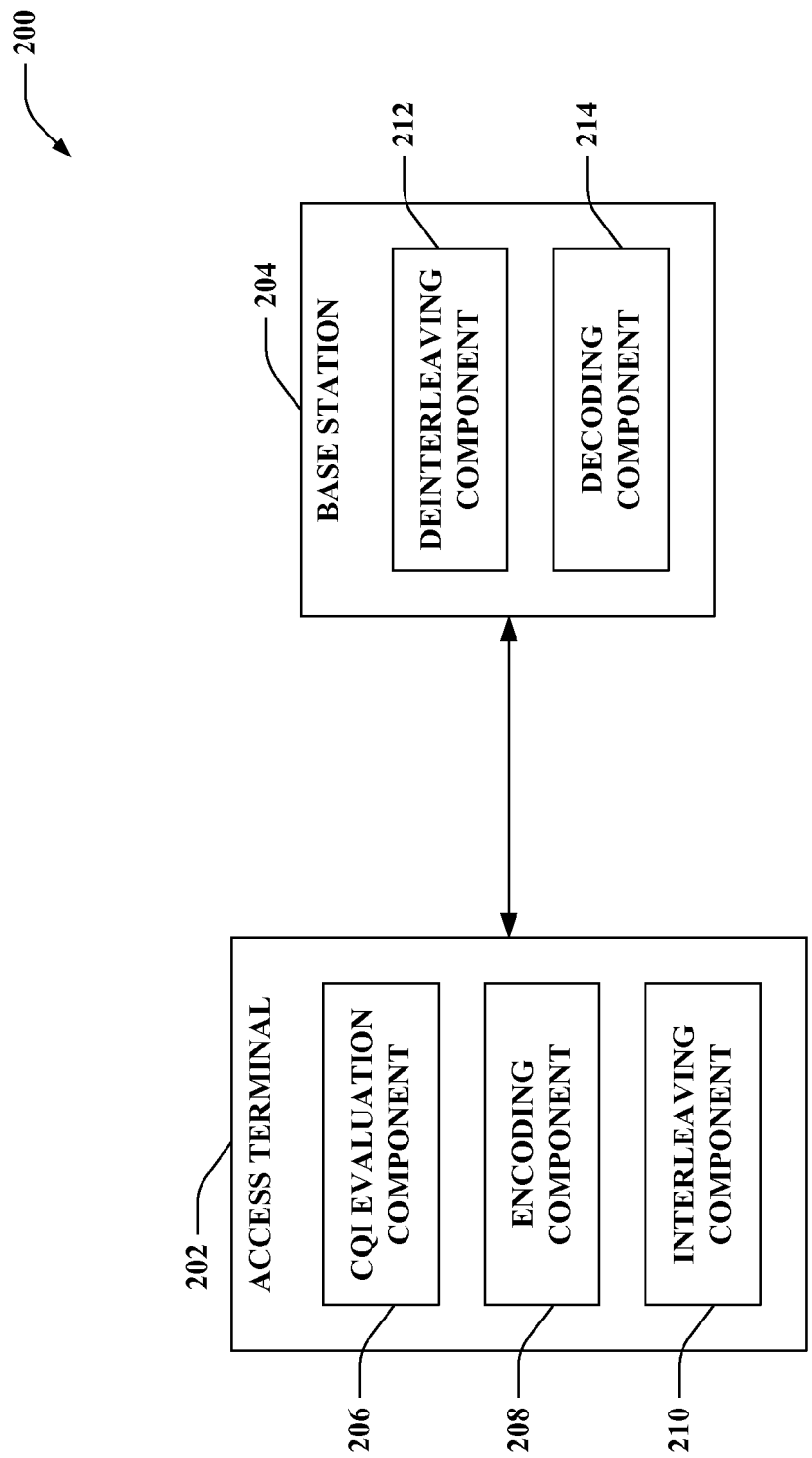
FIG. 2 is an illustration of an example system that interleaves CQI transmissions in a wireless communication environment.

Now referring to FIG. 2, illustrated is a system 200 that interleaves CQI transmissions in a wireless communication environment. System 200 includes an access terminal 202 that can transmit and/or receive information, signals, data, instructions, commands, bits, symbols, and the like. Access terminal 202 can communicate with a base station 204 via the forward link and/or reverse link. Base station 204 can transmit and/or receive information, signals, data, instructions, commands, bits, symbols, and the like. Moreover, although not shown, it is contemplated that any number of access terminals similar to access terminal 202 can be included in system 200 and/or any number of base stations similar to base station 204 can be included in system 200. According to an illustration, system 200 can be a Long Term Evolution (LTE) based system; however, the claimed subject matter is not so limited.

Access terminal 202 can further include a CQI evaluation component 206 that yields CQI reports that provide information related to channel quality. CQI evaluation component 206 can generate the CQI reports with substantially any periodicity. Additionally or alternatively, CQI evaluation component 206 can nonperiodically yield CQI reports. CQI evaluation component 206 can monitor downlink channel conditions to generate the CQI reports. Further, the CQI reports can be used for channel-dependent scheduling by base station 204, and thus, can be fed back to base station 204. The basis for CQI reports yielded by CQI evaluation component 206 can be measurements of downlink reference signals transmitted by base station 204. Moreover, the CQI reports provided by CQI evaluation component 206 can indicate channel quality in both a time domain and a frequency domain.

Further, access terminal 202 can include an encoding component 208 that encodes the CQI reports generated by the CQI evaluation component 206 to yield coded CQI bits. Encoding component 208 can employ a block code for encoding the CQI reports. According to an example, the block code used by encoding component 208 can be a punctured Reed Muller (RM) block code. Following this example, the punctured Reed Muller block code can have a code rate of (20, n), where n is a payload size of the uplink channel (e.g., CQI channel, Physical Uplink Control Channel (PUCCH), Physical Uplink Shared Channel (PUSCH), . . . ). By way of illustration, encoding component 208 can apply the punctured Reed Muller block code to CQI information (e.g., CQI reports, . . . ) generated by CQI evaluation component 206 to form 20 coded CQI bits. Pursuant to a further example, encoding component 208 can block code CQI information, Precoding Matrix Indicator (PMI) information, and/or Rank Indicator (RI) information (e.g., utilizing the punctured Reed Muller block code, . . . ) to yield coded bits. Although much of the following discussion pertains to interleaving coded CQI bits, it is to be appreciated that such examples can be extended to interleaving coded CQI, PMI and/or RI bits.

Moreover, access terminal 202 can include an interleaving component 210 that interleaves the coded CQI bits for transmission. Interleaving of the coded CQI bits can protect a transmission against burst errors. Interleaving component 210 can permute an ordering of the coded CQI bits yielded by encoding component 208. According to an illustration, if encoding component 208 yields 20 coded CQI bits in a given order within a sequence, then interleaving component 210 can alter the order of the 20 coded CQI bits for transmission within a subframe. Following this illustration, a first 10 coded CQI bits as reordered can be transmitted within a first slot of the subframe, while a second 10 coded CQI bits as reordered can be transmitted within a second slot of the subframe. The claimed subject matter, yet, is not limited to the aforementioned illustration as it is contemplated that the coded CQI bits can be sent within more than one subframe, more than two slots, and so forth.

Further, the interleaved, coded CQI bits can be mapped to symbols (e.g., Quadrature Phase Shift Keying (QPSK) symbols, . . . ) and transmitted within a subframe. For example, 20 coded CQI bits yielded by encoding component 208 can be permutated by interleaving component 210 such that an ordering of the 20 coded CQI bits is rearranged. Thereafter, the 20 permutated, coded CQI bits can be mapped to 10 QPSK symbols. Moreover, the 10 QPSK symbols can be transmitted on 10 Localized Frequency Division Multiplexing (LFDM) symbols within a subframe (e.g., 5 LFDM symbols within a first slot of the subframe and 5 LFDM symbols within a second slot of the subframe, . . . ). It is to be appreciated, however, that the claimed subject matter is not limited to the foregoing example.

The permutated, coded CQI bits can be sent by access terminal 202 to base station 204 via the uplink channel. According to an illustration, the uplink channel can be a CQI channel. Further, the uplink channel, for instance, can be a Physical Uplink Control Channel (PUCCH) and/or a Physical Uplink Shared Channel (PUSCH). By way of example, PUSCH can carry user data and the CQI information. Pursuant to another example, PUCCH can carry the CQI information. Following this example, PUCCH can be employed to carry the CQI information when access terminal 202 is not transmitting PUSCH; however, the claimed subject matter is not limited to the aforementioned examples. Moreover, it is to be appreciated that PUSCH and/or PUCCH can carry PMI information and/or RI information in addition to or instead of the CQI information.

Base station 204 can receive the permutated, coded CQI bits sent by access terminal 202 over the uplink channel. Base station 204 can further include a deinterleaving component 212 and a decoding component 214. Deinterleaving component 212 can deinterleave the permutated, coded CQI bits to yield the coded CQI bits in the original ordering (e.g., as outputted by encoding component 208 of access terminal 202 prior to interleaving, . . . ). Thus, deinterleaving component 212 can reverse the rearrangement of the coded CQI bits effectuated by interleaving component 210 of access terminal 202. For example, deinterleaving component 212 can reverse a particular interleaving approach (or plurality of interleaving approaches) used by interleaving component 210 of access terminal 202. Moreover, decoding component 214 can decipher the coded CQI bits to recognize the corresponding CQI information.

Employment of channel interleaver operations for the uplink channel can achieve link performance gain as compared to conventional techniques where no channel interleaving is used for CQI transmissions. These common approaches oftentimes experience diminished performance when the channel is time varying, which can cause bursty errors. For instance, lack of interleaving for the CQI information sent over the uplink channel can result in link level loss when there is large channel fluctuation within the subframe due to the structure of the Reed Muller code.

Figure 3:
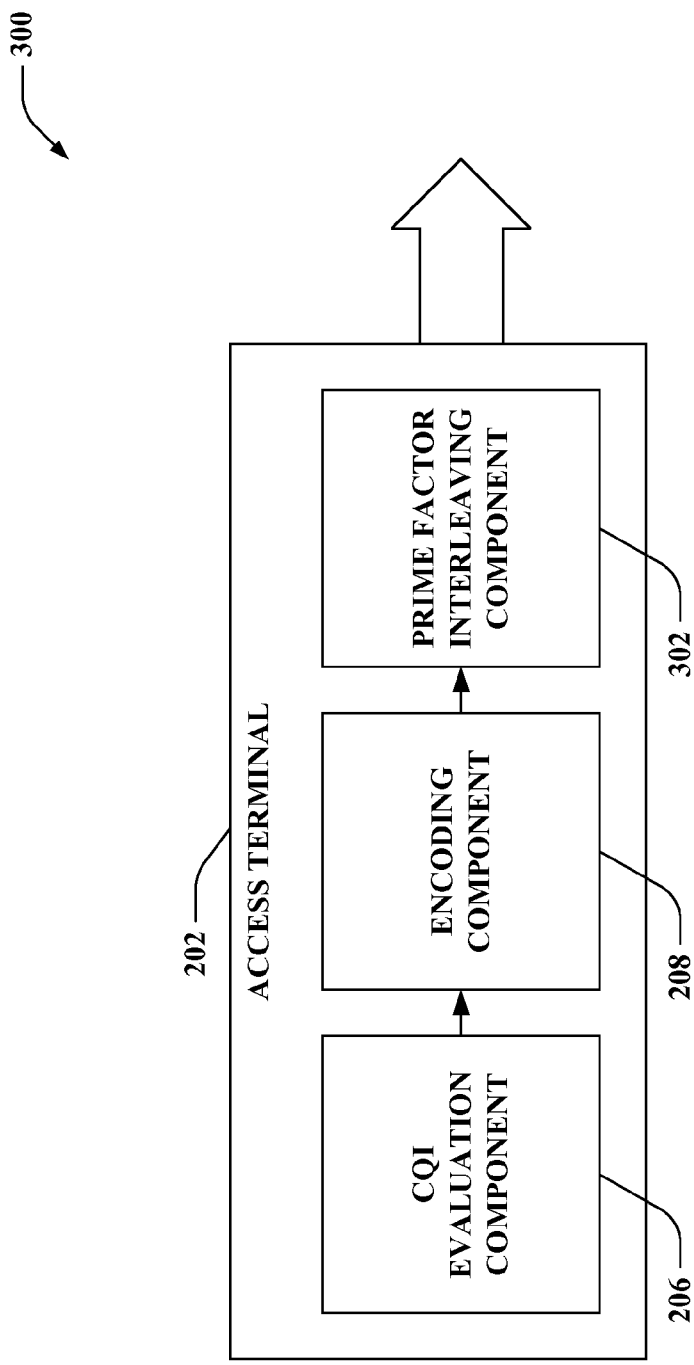
FIG. 3 is an illustration of an example system that employs a prime number based approach for interleaving CQI transmissions in a wireless communication environment.

With reference to FIG. 3, illustrated is a system 300 that employs a prime number based approach for interleaving CQI transmissions in a wireless communication environment. System 300 includes access terminal 202, which can further include CQI evaluation component 206 and encoding component 208. CQI evaluation component 206 can estimate downlink channel conditions and generate CQI information based thereupon. Moreover, encoding component 208 can apply a punctured Reed Muller block code to the CQI information to yield encoded CQI bits.

The encoded CQI bits generated by encoding component 208 can be inputted to a prime factor interleaving component 302. For instance, interleaving component 210 of FIG. 2 can be prime factor interleaving component 302; however, the claimed subject matter is not so limited. Moreover, prime factor interleaving component 302 can permute the encoded CQI bits for transmission over the uplink channel.

Encoding component 208 can provide M encoded CQI bits to prime factor interleaving component 302, where M can be substantially any integer. A (M, n) code can be employed by encoding component 208, where n is a payload size of the uplink channel. For example, M can be 20; however, the claimed subject matter is not so limited. The M encoded CQI bits can be in a sequence, such that a first encoded CQI bit in the sequence can be at a position 0, . . . , and the Mth encoded CQI bit in the sequence can be at a position M-1. Prime factor interleaving component 302 can map an encoded CQI bit in the sequence from an input position K to an output position K1, where K and K1 can each be any positions within the sequence from 0 to M-1.

Prime factor interleaving component 302 can further employ a prime number, Q, for effectuating the mapping. It is to be appreciated that the prime number, Q, can be predefined, dynamically determined, specified by a time varying function, or the like. Moreover, the prime number can also be known by a base station to which the CQI information is transmitted (e.g., base station 204 of FIG. 2, deinterleaving component 212 of FIG. 2, . . . ).

Prime factor interleaving component 302 can map an encoded CQI bit inputted by encoding component 208 at input position K to output position K1 by multiplying K by Q. Prime factor interleaving component 302 can identify the output position K1 as being the product of K times Q modulo M. Thus, prime factor interleaving component 302 can evaluate the following:

$K1 = \mod(K*Q, M)$

By way of example, M can be 20 and Q can be 7. Following this example, prime factor interleaving component 302 can map an encoded CQI bit at position 2 in the inputted sequence obtained from encoding component 208 by multiplying 2 times 7 to yield 14. Further, 14 modulo 20 can be evaluated by prime factor interleaving component 302 to output 14. Hence, the encoded CQI bit at position 2 in the inputted sequence can be mapped to position 14 in the outputted sequence generated by prime factor interleaving component 302. Moreover, FIG. 7 depicts a table 700 that shows values for K that can be inputted to prime factor interleaving component 302 and corresponding values of K1 yielded by prime factor interleaving component 302 pursuant to the aforementioned example. It is to be appreciated, however, that the claimed subject matter is not limited to the foregoing example as it is contemplated that any values for M or Q can be utilized.

Figure 4:
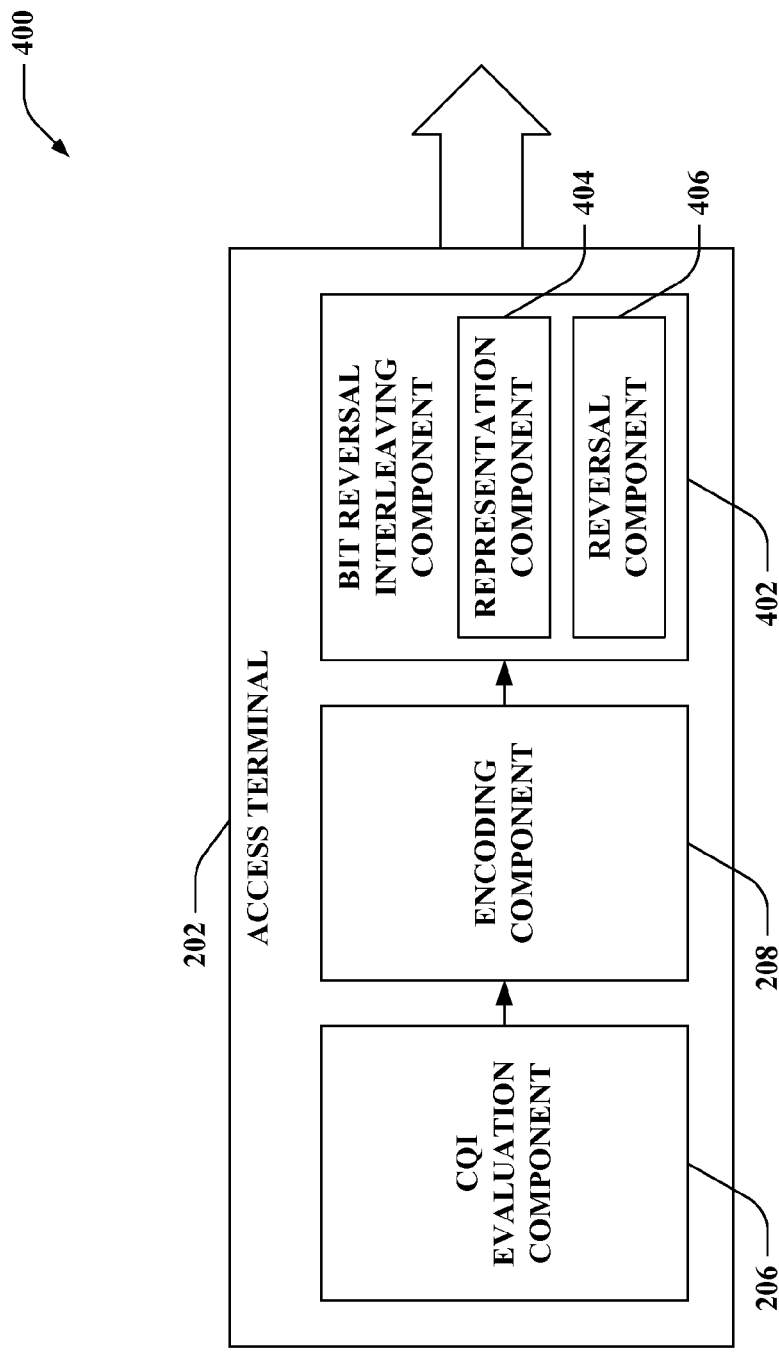
FIG. 4 is an illustration of an example system that utilizes a generalized bit reversal scheme for interleaving CQI transmissions in a wireless communication environment.

Now turning to FIG. 4, illustrated is a system 400 that utilizes a generalized bit reversal scheme for interleaving CQI transmissions in a wireless communication environment. System 400 includes access terminal 202, which can further comprise CQI evaluation component 206 and encoding component 208. Access terminal 202 can also include a bit reversal interleaving component 402 (e.g., interleaving component 210 of FIG. 2, . . . ) that can permute the sequence of encoded CQI bits utilizing generalized bit reversal interleaving with a non-binary alphabet that can be achieved based on prime factor decomposition of the total encoded bits, M, yielded by encoding component 208.

Bit reversal interleaving component 402 can decompose M into prime factors. For instance, prime factor decomposition can yield $M = \alpha_0^{n0} \alpha_1^{n1} \ldots \alpha_p^{np}$, where $\alpha_0, \alpha_1, \ldots,$ and $\alpha_p$ are prime factors of M and n0, n1, . . . , np are respective multiplicities of each of the corresponding prime factors. According to the example described herein where M is 20, bit reversal interleaving component 402 can decompose M=20 to yield 2×5.

A traditional bit reversal interleaver can be defined for $M = \alpha_0^{n0}$ with $\alpha_0 = 2$. This conventional approach can be applied to the size M which is a power of 2. In contrast, bit reversal interleaving component 402 can effectuate generalized interleaving for any arbitrary number of M by extending an alphabet from binary to higher order based on the prime number decomposition. The bit reversal operation can then be based on the higher order alphabet.

Bit reversal interleaving component 402 can further include a representation component 404 and a reversal component 406. Representation component 404 can represent an input position, K, with the alphabet defined by the prime factor decomposition of M. Returning to the aforementioned example where M is 20, the input position can be represented with a three digit number (abc), where the alphabet for the bit positions is 2, 2, and 5 since M=2×2×5. Accordingly, representation component 404 can determine the three digit number corresponding to an input position, K, by evaluating the following:

$K = 10a + 5b + c$, where $a = \{0,1\}$, $b = \{0,1\}$, and $c = \{0,1,2,3,4\}$

For instance, representation component 404 can employ the foregoing to identify that input position 4 corresponds to the three digit number 004, input position 5 corresponds to the three digit number 010, and so forth.

Moreover, reversal component 406 can bit reverse the three digit number represented with the extended alphabet yielded by representation component 404. New bit positions (e.g., output positions, . . . ) can be read out as the interleaved positions based upon the output of reversal component 406. Reversal component 406 can flip the three digit number with the extended alphabet. Thus, following the above example where M is 20, an output position, K2, can be generated by reversal component 406 analyzing the following:

$$K2=4c+2b+a, \text{ where } a=\{0,1\}, b=\{0,1\}, \text{ and } c=\{0,1,2,3,4\}$$

Hence, the three digit number (abc) recognized by representation component 404 to correspond to an input position, K, can be utilized by reversal component 406 to determine an output position, K2. By way of illustration, as noted above, representation component 404 can recognize that input position 4 corresponds to the three digit number 004; reversal component 406 can bit reverse the three digit number 004 to yield a bit reversed three digit number 400 (cba). Thus, the alphabet for the bit positions in the bit reversed three digit number is 5, 2, and 2. Hence, reversal component 506 can determine that the output position, K2, that corresponds to the bit reversed three digit number 400 is 16 (e.g., 4*4+2*0+0=16, . . . ). Further, FIG. 7 illustrates a table 700 that shows values for K that can be inputted to bit reversal interleaving component 402 and corresponding values of K2 yielded by bit reversal interleaving component 402 pursuant to the aforementioned example. It is to be appreciated, however, that the claimed subject matter is not limited to the foregoing example as it is contemplated that any value for M can be leveraged.

Figure 5:
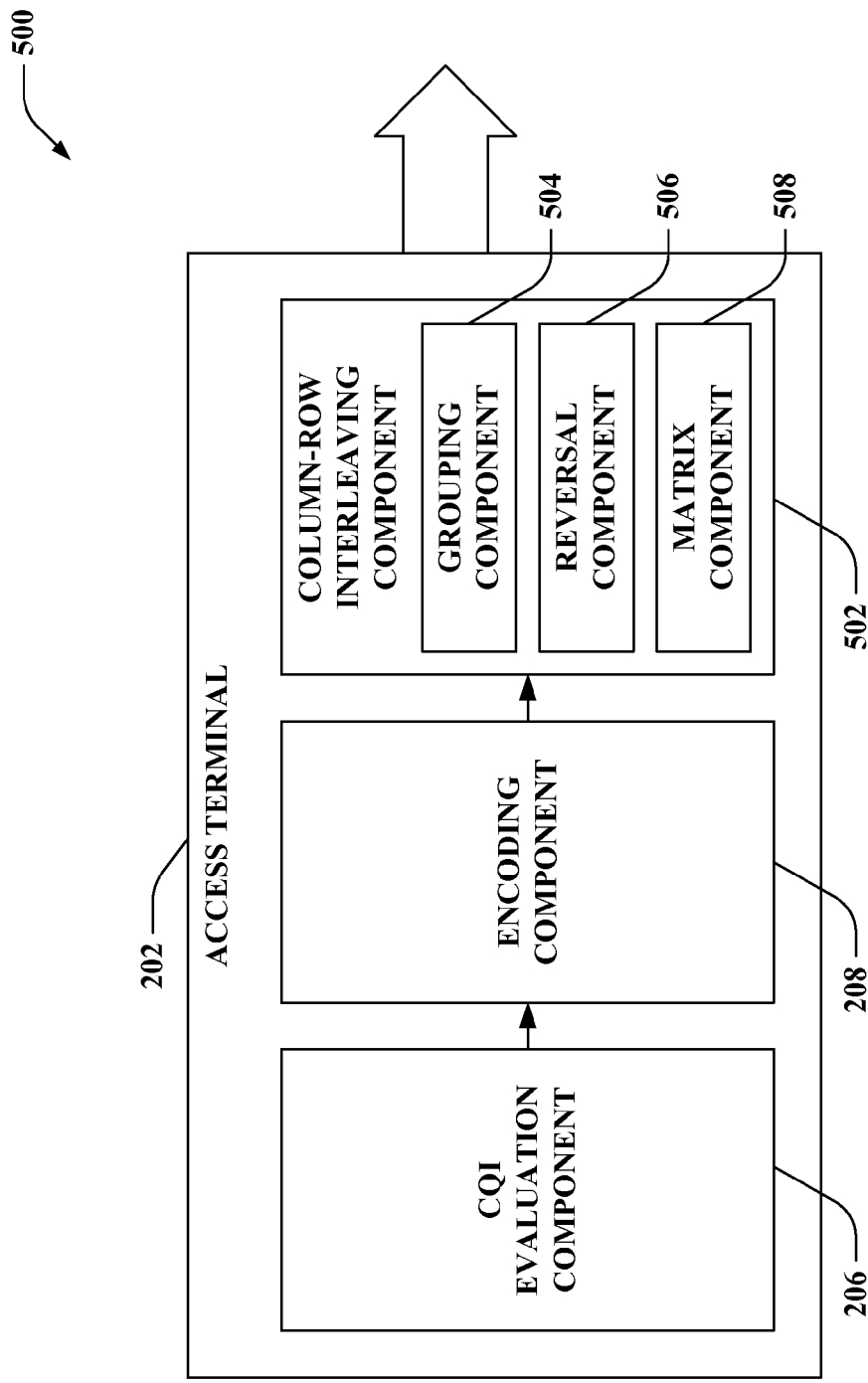
FIG. 5 is an illustration of an example system that leverages a column-row approach with column bit reversal for interleaving encoded CQI bits in a wireless communication environment.

Referring to FIG. 5, illustrated is a system 500 that leverages a column-row approach with column bit reversal for interleaving encoded CQI bits in a wireless communication environment. System 500 includes access terminal 202, which can send interleaved CQI information over an uplink channel. Access terminal 202 can include CQI evaluation component 206 and encoding component 208. Moreover, access terminal 202 can include a column-row interleaving component 502 (e.g., interleaving component 210 of FIG. 2, . . . ).

Column-row interleaving component 502 can further include a grouping component 504, a reversal component 506, and a matrix component 508. Grouping component 504 can decompose the M input bit positions of the sequence of encoded CQI bits yielded by encoding component 208 into X groups, each of which include Y elements. X and Y can each be integers, such that X times Y equals M. Further, Y can be an integer equal to $2^z$, where z is an integer. Following the example where M equals 20, grouping component 504 can decompose the 20 input bit positions into 5 groups of 4 elements each. Thus, grouping component 504 can generate a first group that includes input positions 0, 1, 2, and 3, a second group that includes input positions 4, 5, 6, and 7, and so forth.

Reversal component 506 can apply bit reversal for each of the groups. In particular, the input positions within the groups can each be represented as a binary number. Further, reversal component 506 can swap a number of least significant bits of each of the binary numbers. The number of least significant bits to be swapped can be a function of Y. For instance, the number of least significant bits can be equal to $\log_2(Y)$. Thus, following the above example where Y equals 4, two least significant bits of each of the binary numbers can be swapped; however, the claimed subject matter is not so limited. Moreover, reversal component 506 can yield respective decimals that correspond to the binary numbers with swapped least significant bits. By way of example, if the first group includes input positions 0, 1, 2, and 3, then these input positions can be represented by 00, 01, 10, and 11, respectively. Reversal component 506 can apply bit reversal for the two least significant bits for each of the binary numbers, which can yield 00, 10, 01, and 11, respectively. Thereafter, reversal component 506 can convert these binary numbers to decimals, namely 0, 2, 1, and 3, respectively. Similarly, if the second group includes input positions 4, 5, 6, and 7, then these input positions can be represented by 100, 101, 110, and 111, respectively. Upon effectuating bit reversal for the two least significant bits, reversal component 506 can convert the binary representations to 100, 110, 101, and 111, respectively. Further, reversal component 506 can output corresponding decimals: 4, 6, 5, and 7, respectively. Reversal component 506 can similarly reverse the two least significant bits for the remainder of the groups separated by grouping component 504.

Matrix component 508 can write the X groups outputted by reversal component 506 into a matrix row by row. Thus, per the aforementioned example, the 5 groups can be written into the matrix, each group included into a corresponding, respective row. Moreover, matrix component 508 can read out values from the matrix column by column. According to the above example, matrix component 508 can incorporate the following rows into the matrix: row 1 can include 0, 2, 1, and 3; row 2 can include 4, 6, 5, and 7; row 3 can include 8, 10, 9, and 11; row 4 can include 12, 14, 13, and 15; and row 5 can include 16, 18, 17, and 19. Following this example, matrix component 508 can read column by column from the matrix. Hence, four columns can be read by matrix component 508. Matrix component 508 can read column 1, which can include 0, 4, 8, 12, and 16, then column 2, which can include 2, 6, 10, 14, and 18, followed by column 3, which can include 1, 5, 9, 13, and 17, and then column 4, which can include 3, 7, 11, 15, and 19.

The resulting interleaved pattern yielded by column-row interleaving component 502 for the case of 20 coded bits (e.g., M equals 20, . . . ) can be the same as the pattern yielded by bit reversal interleaving component 402 of FIG. 4 (e.g., K2, . . . ). Thus, as shown in FIG. 7, table 700 illustrates values for K that can be inputted to column-row interleaving component 502 and corresponding values of K2 yielded by column-row interleaving component 502 pursuant to the above example. It is to be appreciated, however, that the claimed subject matter is not limited to the foregoing example as it is contemplated that any value for M can be utilized.

Figure 6:
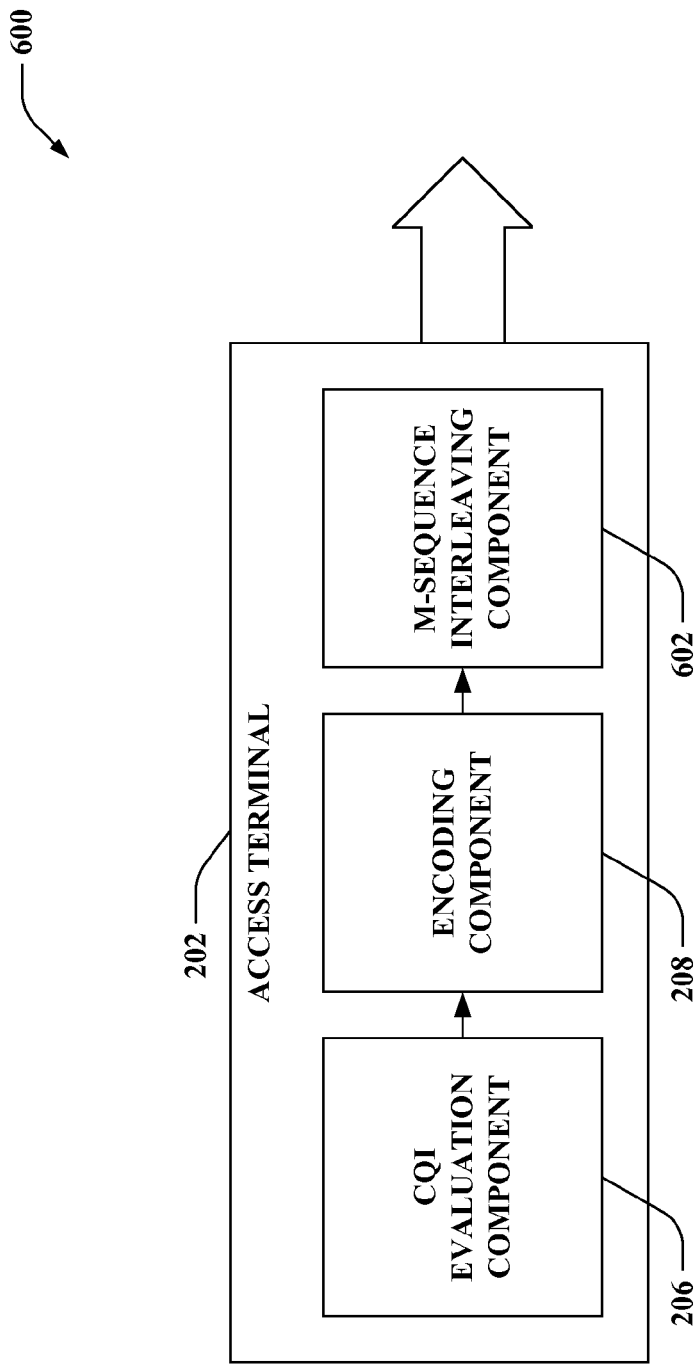
FIG. 6 is an illustration of an example system that utilizes an M-sequence design for interleaving transmissions sent over an uplink channel in a wireless communication environment.

Turning to FIG. 6, illustrated is a system 600 that utilizes an M-sequence design for interleaving transmissions sent over an uplink channel in a wireless communication environment. System 600 includes access terminal 202, which can further include CQI evaluation component 206 and encoding component 208. Moreover, access terminal 202 can include an M-sequence interleaving component 602 (e.g., interleaving component 210 of FIG. 2, . . . ).

M-sequence interleaving component 602 can leverage the principle that a first six basis vectors of a Reed Muller code are the same as certain columns of a 32×32 Hadamard matrix, which can be transformed to M-sequences with a common row permutation. For length 32, there are 6 possible permutations (under the equivalence of cyclic shifts). M-sequence interleaving component 602 can employ one of the 6 possible permutations. Further, M-sequence interleaving component 602 can puncture the length 32 interleaver pattern in the same manner as the CQI codewords are punctured relative to the Reed Muller code (e.g., by encoding component 208, More particularly, as shown in FIG. 7, table 700 includes input positions, K, that can be inputted to M-sequence interleaving component 602, and output positions, K3, that can respectively be outputted by M-sequence interleaving component 602. The interleaved pattern of K3 corresponds to one of the 6 possible permutations that can be used by M-sequence interleaving component 602.

Referring now to FIG. 7, illustrated is an example table 700 that includes a sequence of input positions, K, as well as possible output sequences that can be yielded by CQI interleaving approaches described herein. More particularly, input position, K, can be used as input to one or more of the interleaving scenarios described herein. For instance, an input position, K, can be inputted to a prime number based interleaving approach (e.g., described in FIG. 3, . . . ) to yield a corresponding output position, K1. Moreover, an input position, K, can be inputted to a generalized bit reversal interleaver (e.g., as described in FIG. 4, . . . ) or a column-row interleaver (e.g., as set forth in FIG. 5, . . . ) to generate a corresponding output position, K2. Further, an input position, K, can be inputted to M-sequence interleaving component 602 of FIG. 6 to yield a corresponding output position, K3.

It is contemplated that one or more of the interleaving approaches described herein can be employed for permuting encoded CQI bits for transmission over an uplink channel. For instance, one of the interleaving approaches can be applied. By way of another illustration, two (or more) of the interleaving approaches can be utilized in series to permute the encoded CQI bits. Pursuant to another example, a first interleaving approach can be utilized during a first time period, for sending CQI transmissions to a first base station, or the like, while a second interleaving approach can be employed during a second time period, for sending CQI transmissions to a second base station, and so forth. Moreover, it is to be appreciated that the claimed subject matter is not limited to the example sequences described in table 700 (e.g., any length input sequences, M, can be utilized in connection with the claimed subject matter, any prime number, Q, can be utilized for prime factor interleaving, . . . ).

Figure 8:
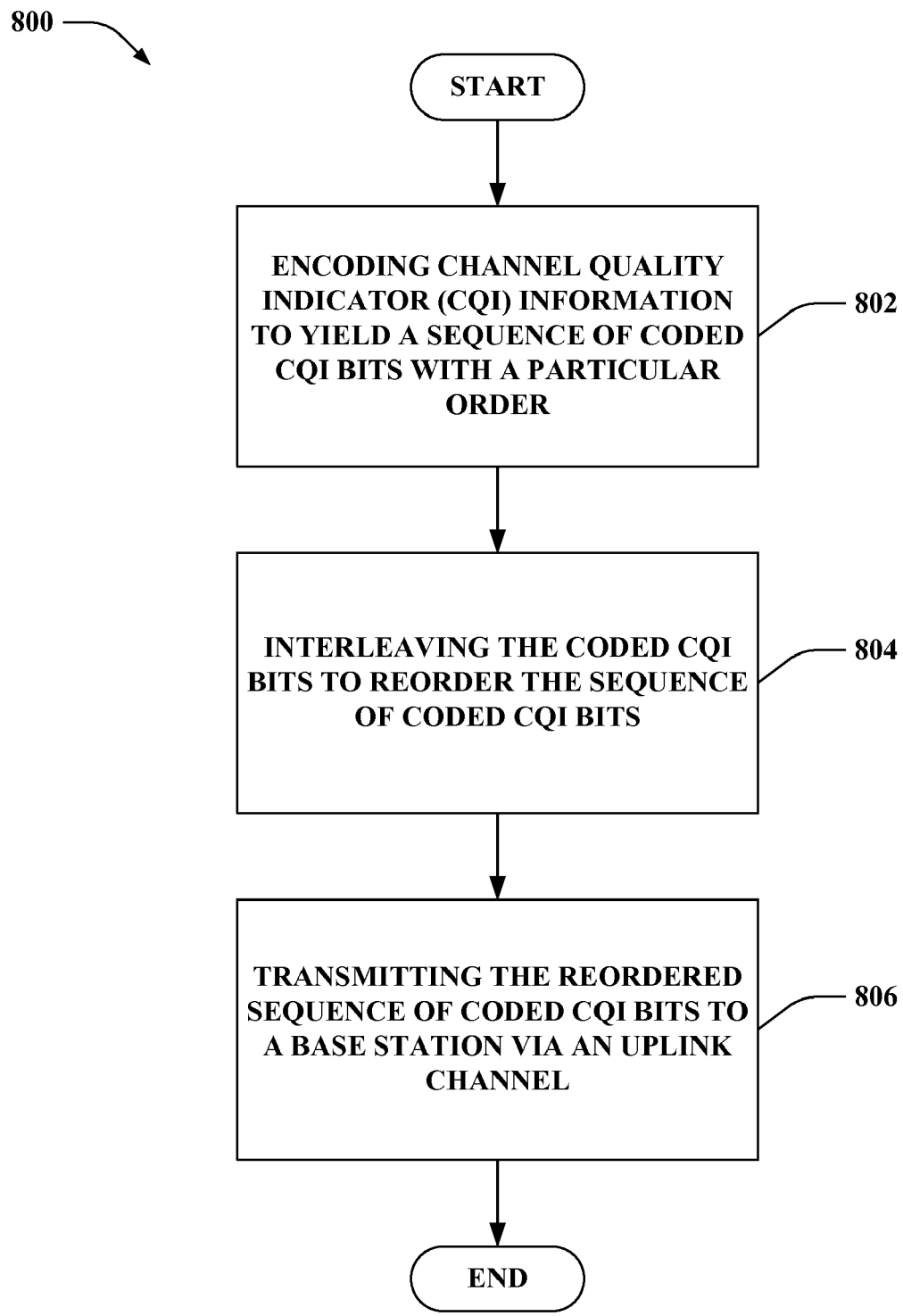
FIG. 8 is an illustration of an example methodology that facilitates sending Channel Quality Indicator (CQI) information in a wireless communication environment.
Figure 9:
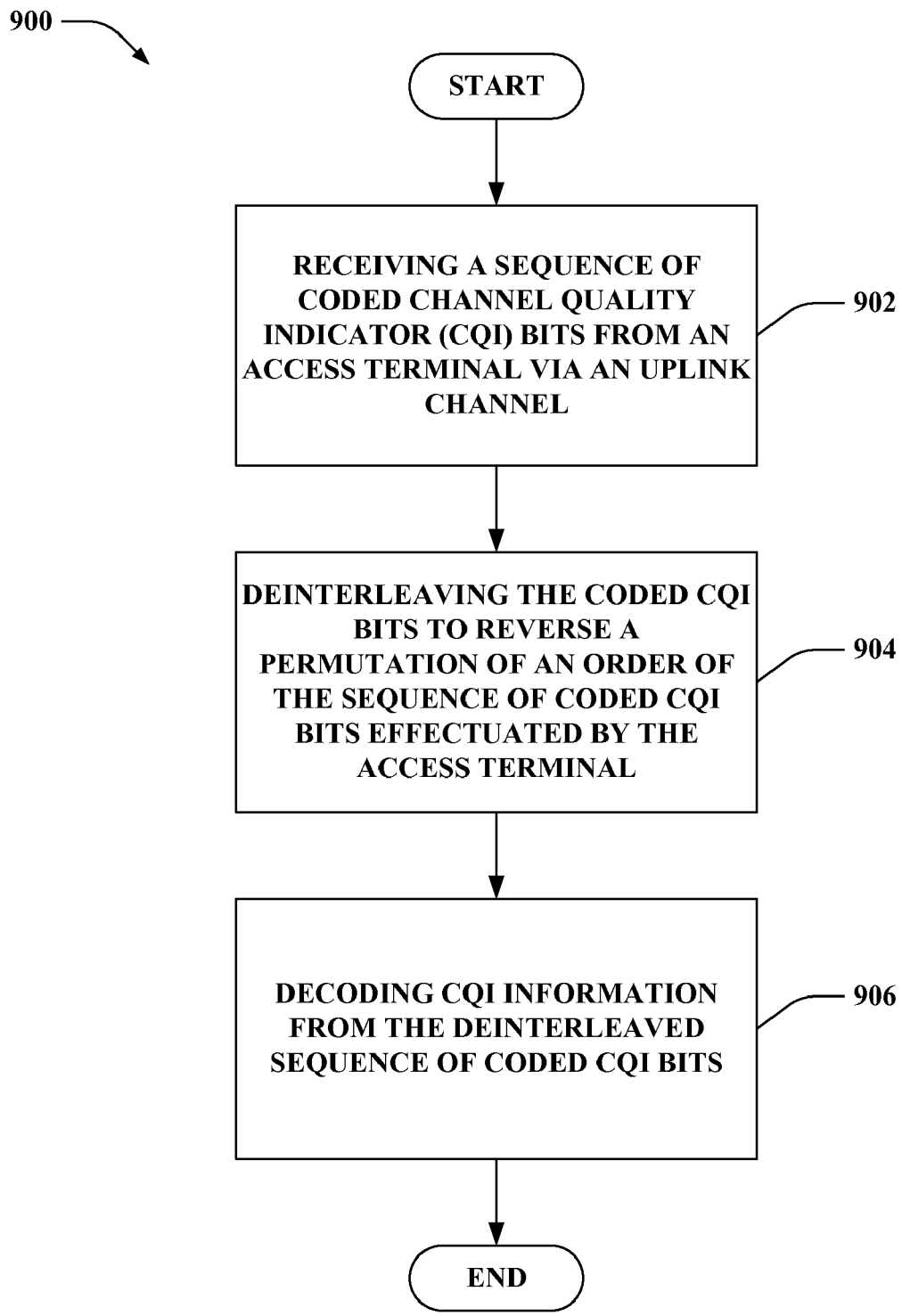
FIG. 9 is an illustration of an example methodology that facilitates obtaining Channel Quality Indicator (CQI) information in a wireless communication environment.

Referring to FIGS. 8-9, methodologies relating to feeding back CQI information in a wireless communication environment are illustrated. While, for purposes of simplicity of explanation, the methodologies are shown and described as a series of acts, it is to be understood and appreciated that the methodologies are not limited by the order of acts, as some acts can, in accordance with one or more embodiments, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts can be required to implement a methodology in accordance with one or more embodiments.

With reference to FIG. 8, illustrated is a methodology 800 that facilitates sending Channel Quality Indicator (CQI) information in a wireless communication environment. At 802, Channel Quality Indicator (CQI) information can be encoded to yield a sequence of coded CQI bits with a particular order. For example, the CQI information can be encoded using a punctured Reed Muller (RM) block code. Following this example, the sequence yielded by the punctured Reed Muller block code can include M coded CQI bits, where M can be substantially any integer. According to an illustration, M can be 20; however, the claimed subject matter is not so limited. Pursuant to a further example, the CQI information can be encoded along with Precoding Matrix Indicator (PMI) information and/or Rank Indicator (RI) information (e.g., using the punctured Reed Muller block code, . . . ), and thus, the sequence can include M coded bits related to CQI, PMI and/or RI.

At 804, the coded CQI bits can be interleaved to reorder the sequence of coded CQI bits. It is contemplated that one or more interleaving techniques can be employed to reorder the sequence of coded CQI bits. For instance, each of the coded CQI bits in the sequence can be associated with a respective input position, K (e.g., a range of input positions within the sequence can be from 0 to M-1, . . . ). Moreover, depending upon the interleaving technique(s) utilized, the respective input position of each of the coded CQI bits can map to a corresponding output position within the reordered sequence (e.g., a range of output positions within the reordered sequence can be from 0 to M-1, . . . ). For instance, a one-to-one mapping between input positions and output positions can be leveraged. Further, the reordered sequence of coded CQI bits can be mapped to symbols (e.g., Quadrature Phase Shift Keying (QPSK) symbols, . . . ). For example, if M equals 20, then the reordered sequence includes 20 permuted, coded CQI bits, which can be mapped to 10 QPSK symbols. At 806, the reordered sequence of coded CQI bits can be transmitted to a base station via an uplink channel. The reordered sequence of coded CQI bits can be sent within a common subframe (e.g., in two slots of the common subframe, . . . ). Following the above example, the 10 QPSK symbols can be transmitted on 10 Localized Frequency Division Multiplexing (LFDM) symbols within a subframe. Yet, the claimed subject matter is not limited to the foregoing example. Further, the uplink channel can be a Physical Uplink Control Channel (PUCCH), a Physical Uplink Shared Channel (PUSCH), a CQI channel, and so forth.

According to an example, the coded CQI bits can be interleaved by employing a prime number based interleaving technique. Following this example, for each coded CQI bit, an input position, K, can be multiplied by a prime number, Q. Moreover, a corresponding output position, K1, for each coded CQI bit within the reordered sequence can be identified as the product of K multiplied by Q modulo M. It is contemplated that the prime number, Q, can be predefined, dynamically determined, specified by a time varying function, and so forth.

By way of a further example, the coded CQI bits can be interleaved by utilizing a generalized bit reversal interleaving scheme. Accordingly, a total number of coded CQI bits, M, can be decomposed into prime factors. Prime factor decomposition can yield $M = \alpha_0^{n_0} \alpha_1^{n_1} \ldots \alpha_p^{n_p}$, where $\alpha_0, \alpha_1, \ldots$ and $\alpha_p$ are prime factors of M and n0, n1, . . . , np are respective multiplicities of each of the corresponding prime factors. Pursuant to an illustration, if M is 20, prime factor decomposition of M=20 can yield $2^2 \times 5$. Moreover, for each coded CQI bit, an input position, K, can be represented with an alphabet defined by the prime factor decomposition of M. According to the above illustration, the input position, K, can be represented with a three digit number, where the alphabet for the input positions is 2, 2, and 5. Hence, based upon the input position, K, the three digit number (abc) can be yielded by evaluating K=10a+5b+c, where a={0,1}, b={0,1}, and c={0, 1,2,3,4}. Further, the three digit representation can be bit reversed with the extended alphabet. The bit reversed three digit representation can thereafter be read out to yield a corresponding output position, K2. For instance, the corresponding output position, K2, can be generated by analyzing K2=4c+2b+a, where a={0,1}, b={0,1}, and c={0,1,2,3,4}.

In accordance with another example, the coded CQI bits can be interleaved by employing a column-row interleaving approach with column bit reversal. A total number of coded CQI bits, M, can be decomposed into X groups, each including Y coded CQI bits, where X multiplied by Y equals M (e.g., X and Y are each integers, . . . ). Moreover, Y (e.g., number of coded CQI bits, . . . ) can equal $2^z$, where z is an integer. For instance, if M is 20, then 5 groups, each including 4 coded CQI bits, can be formed. Further, a first Y coded CQI bits of the sequence can be included in a first group, a second Y coded CQI bits of the sequence can be included in a second group, and so forth. Moreover, bit reversal can be applied for each of the groups. By way of illustration, bit reversal can be effectuated by representing an input position, K, for each of the coded CQI bits as a binary number, swapping $\log_2(Y)$ least significant bits of the binary number, and converting the binary number with the swapped $\log_2(Y)$ least significant bits to a decimal corresponding to the coded CQI bit. Per the above example where M equals 20 and Y equals 4, two least significant bits of each binary number can be swapped; however, the claimed subject matter is not so limited. Additionally, upon performing bit reversal, the groups can be read into a matrix row by row, where the decimals yielded from bit reversal for each group can be included in a respective row of the matrix. Further, the decimals can be read out of the matrix column by column to identify a permuted ordering for the sequence of coded CQI bits.

By way of another example, the coded CQI bits can be interleaved by utilizing an M-sequence based interleaving technique. The M-sequence can be obtained from a Hadamard matrix. For instance, columns from the Hadamard matrix can be transformed to M-sequences with common row permutation. A particular one of the yielded M-sequences can be utilized as an interleaver pattern to reorder the sequence of coded CQI bits.

Turning to FIG. 9, illustrated is a methodology 900 that facilitates obtaining Channel Quality Indicator (CQI) information in a wireless communication environment. At 902, a sequence of coded Channel Quality Indicator (CQI) bits can be received from an access terminal via an uplink channel. For instance, the coded CQI bits can be received in a common subframe. At 904, the coded CQI bits can be deinterleaved to reverse a permutation of an order of the sequence of coded CQI bits effectuated by the access terminal. The coded CQI bits can be deinterleaved by leveraging a one-to-one mapping between input positions and output positions utilized by the access terminal for permutation of the order. For instance, the one-to-one mapping can be yielded based upon prime factor interleaving. According to another example, the one-to-one mapping can be recognized as a function of generalized bit reversal interleaving with prime factor decomposition. By way of a further example, the one-to-one mapping can be identified based upon column-row interleaving with column bit reversal. Pursuant to another example, the one-to-one mapping can be determined as a function of M-sequence based interleaving. At 906, CQI information can be decoded from the deinterleaved sequence of coded CQI bits.

It will be appreciated that, in accordance with one or more aspects described herein, inferences can be made regarding interleaving CQI transmissions in a wireless communication environment. As used herein, the term to "infer" or "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

Figure 10:
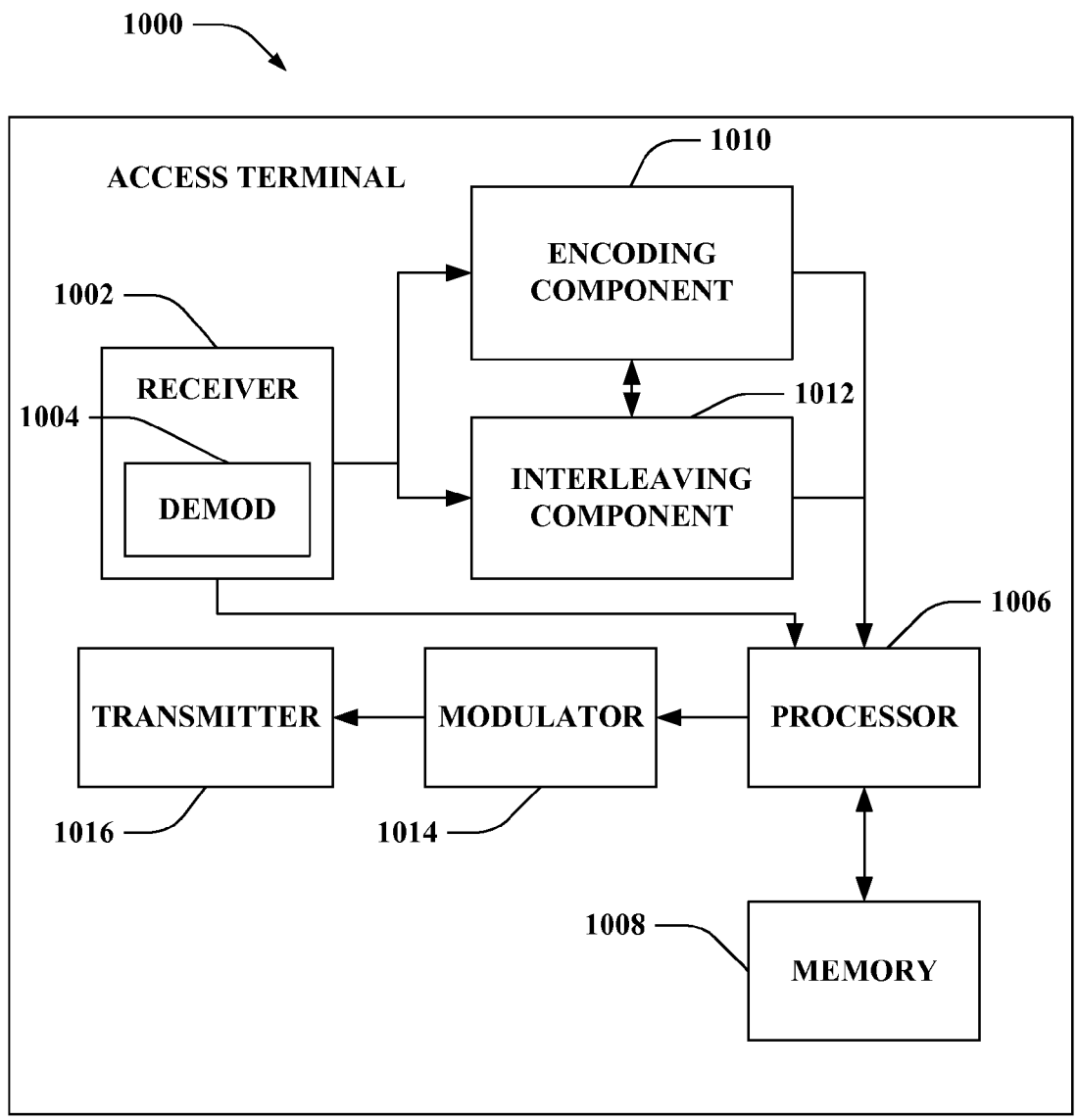
FIG. 10 is an illustration of an example access terminal that sends interleaved CQI information in a wireless communication system.

FIG. 10 is an illustration of an access terminal 1000 that sends interleaved CQI information in a wireless communication system. Access terminal 1000 comprises a receiver 1002 that receives a signal from, for instance, a receive antenna (not shown), and performs typical actions thereon (e.g., filters, amplifies, downconverts, etc.) the received signal and digitizes the conditioned signal to obtain samples. Receiver 1002 can be, for example, an MMSE receiver, and can comprise a demodulator 1004 that can demodulate received symbols and provide them to a processor 1006 for channel estimation. Processor 1006 can be a processor dedicated to analyzing information received by receiver 1002 and/or generating information for transmission by a transmitter 1016, a processor that controls one or more components of access terminal 1000, and/or a processor that both analyzes information received by receiver 1002, generates information for transmission by transmitter 1016, and controls one or more components of access terminal 1000.

Access terminal 1000 can additionally comprise memory 1008 that is operatively coupled to processor 1006 and that can store data to be transmitted, received data, and any other suitable information related to performing the various actions and functions set forth herein. Memory 1008, for instance, can store protocols and/or algorithms associated with generating CQI information, encoding CQI information, and/or interleaving encoded CQI information.

It will be appreciated that the data store (e.g., memory 1008) described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable PROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 1008 of the subject systems and methods is intended to comprise, without being limited to, these and any other suitable types of memory.

Processor 1006 can be operatively coupled to an encoding component 1010 and/or an interleaving component 1012. Encoding component 1010 can be substantially similar to encoding component 208 of FIG. 2 and/or interleaving component 1012 can be substantially similar to interleaving component 210 of FIG. 2. Encoding component 1010 can encode CQI information to yield a sequence of coded CQI bits. Moreover, interleaving component 1012 can permute an order of the coded CQI bits in the sequence. Moreover, although not shown, it is contemplated that access terminal 1000 can further include a CQI evaluation component, which can be substantially similar to CQI evaluation component 206 of FIG. 2. Access terminal 1000 still further comprises a modulator 1014 and a transmitter 1016 that transmits data, signals, etc. to a base station. Although depicted as being separate from the processor 1006, it is to be appreciated that encoding component 1010, interleaving component 1012 and/or modulator 1014 can be part of processor 1006 or a number of processors (not shown).

Figure 11:
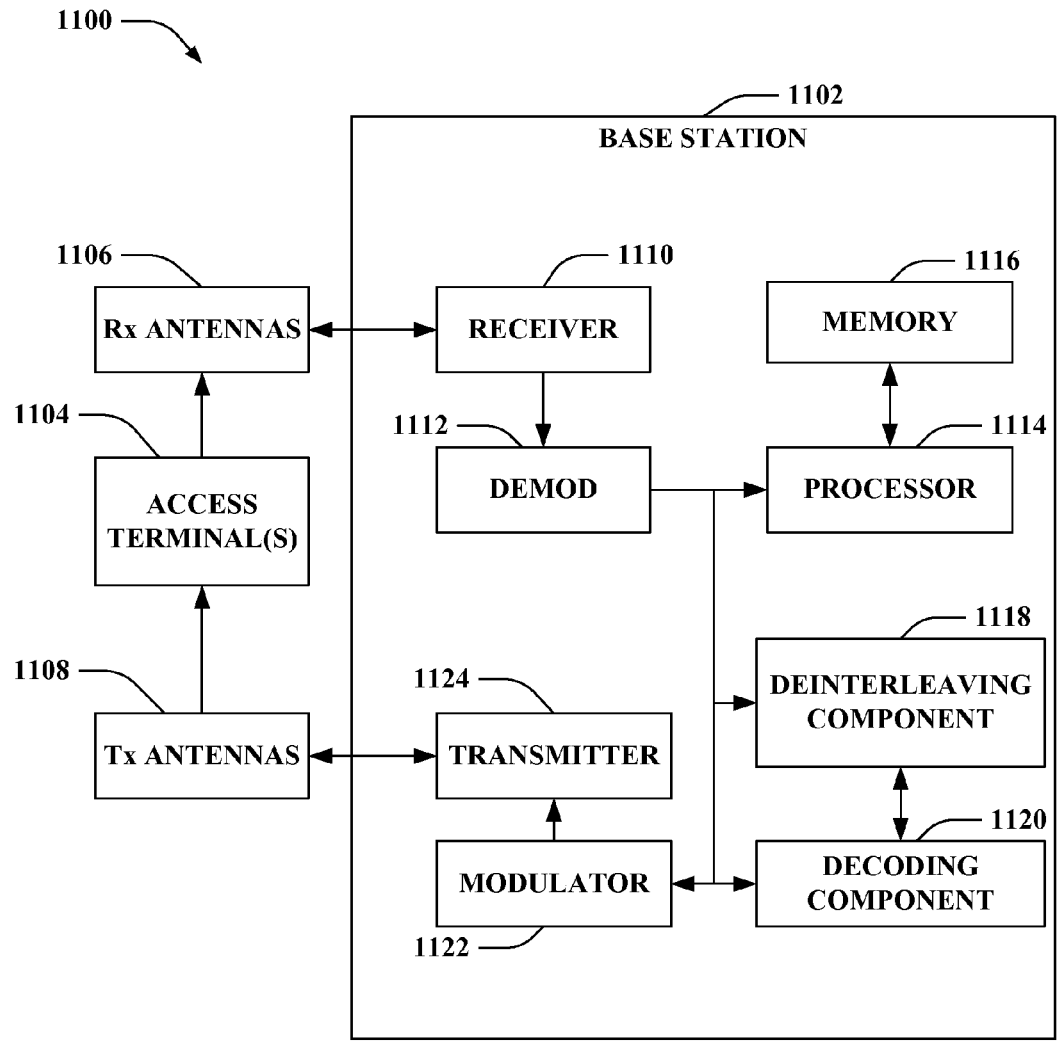
FIG. 11 is an illustration of an example system that obtains interleaved CQI information in a wireless communication environment.

FIG. 11 is an illustration of a system 1100 that obtains interleaved CQI information in a wireless communication environment. System 1100 comprises a base station 1102 (e.g., access point, . . . ) with a receiver 1110 that receives signal(s) from one or more access terminals 1104 through a plurality of receive antennas 1106, and a transmitter 1124 that transmits to the one or more access terminals 1104 through a transmit antenna 1108. Receiver 1110 can receive information from receive antennas 1106 and is operatively associated with a demodulator 1112 that demodulates received information. Demodulated symbols are analyzed by a processor 1114 that can be similar to the processor described above with regard to FIG. 10, and which is coupled to a memory 1116 that stores data to be transmitted to or received from access terminal(s) 1104 and/or any other suitable information related to performing the various actions and functions set forth herein. Processor 1114 is further coupled to a deinterleaving component 1118 and/or a decoding component 1120. It is to be appreciated that deinterleaving component 1118 can be substantially similar to deinterleaving component 212 of FIG. 2 and/or decoding component 1120 can be substantially similar to decoding component 214 of FIG. 2. Deinterleaving component 1118 can deinterleave coded CQI bits in a sequence as received from access terminal(s) 1104. Moreover, decoding component 1120 can decode the deinterleaved, coded CQI bits to recognize CQI information provided by access terminal(s) 1104. Base station 1102 can further include a modulator 1122. Modulator 1122 can multiplex a frame for transmission by a transmitter 1124 through antennas 1108 to access terminal(s) 1104 in accordance with the aforementioned description. Although depicted as being separate from the processor 1114, it is to be appreciated that deinterleaving component 1118, decoding component 1120, and/or modulator 1122 can be part of processor 1114 or a number of processors (not shown).

Figure 12:
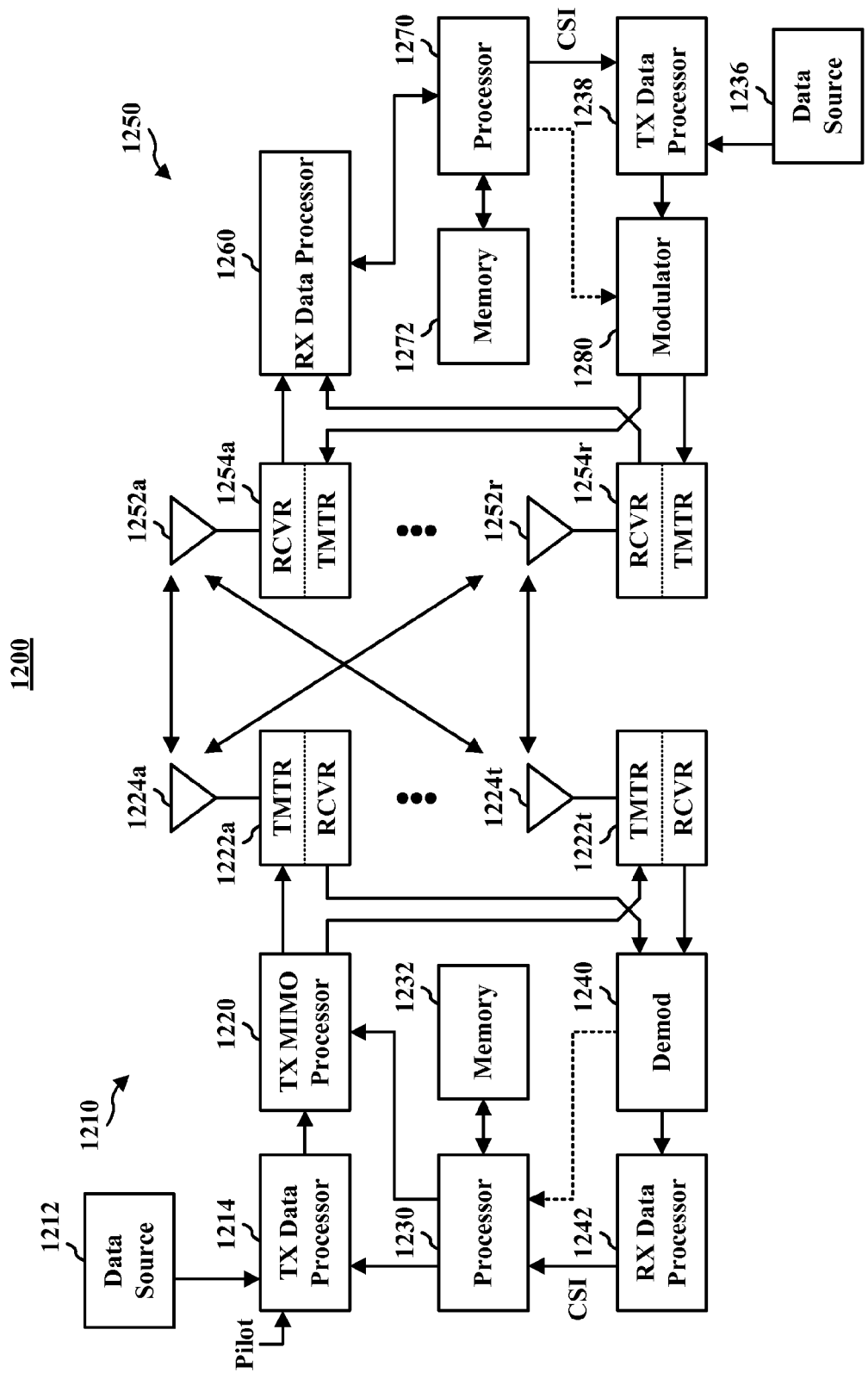
FIG. 12 is an illustration of an example wireless network environment that can be employed in conjunction with the various systems and methods described herein.

FIG. 12 shows an example wireless communication system 1200. The wireless communication system 1200 depicts one base station 1210 and one access terminal 1250 for sake of brevity. However, it is to be appreciated that system 1200 can include more than one base station and/or more than one access terminal, wherein additional base stations and/or access terminals can be substantially similar or different from example base station 1210 and access terminal 1250 described below. In addition, it is to be appreciated that base station 1210 and/or access terminal 1250 can employ the systems (FIGS. 1-6, 10-11, and 13) and/or methods (FIGS. 8-9) described herein to facilitate wireless communication there between.

At base station 1210, traffic data for a number of data streams is provided from a data source 1212 to a transmit (TX) data processor 1214. According to an example, each data stream can be transmitted over a respective antenna. TX data processor 1214 formats, codes, and interleaves the traffic data stream based on a particular coding scheme selected for that data stream to provide coded data.

The coded data for each data stream can be multiplexed with pilot data using orthogonal frequency division multiplexing (OFDM) techniques. Additionally or alternatively, the pilot symbols can be frequency division multiplexed (FDM), time division multiplexed (TDM), or code division multiplexed (CDM). The pilot data is typically a known data pattern that is processed in a known manner and can be used at access terminal 1250 to estimate channel response. The multiplexed pilot and coded data for each data stream can be modulated (e.g., symbol mapped) based on a particular modulation scheme (e.g., binary phase-shift keying (BPSK), quadrature phase-shift keying (QPSK), M-phase-shift keying (M-PSK), M-quadrature amplitude modulation (M-QAM), etc.) selected for that data stream to provide modulation symbols. The data rate, coding, and modulation for each data stream can be determined by instructions performed or provided by processor 1230.

The modulation symbols for the data streams can be provided to a TX MIMO processor 1220, which can further process the modulation symbols (e.g., for OFDM). TX MIMO processor 1220 then provides $N_T$ modulation symbol streams to $N_T$ transmitters (TMTR) 1222a through 1222t. In various embodiments, TX MIMO processor 1220 applies beamforming weights to the symbols of the data streams and to the antenna from which the symbol is being transmitted.

Each transmitter 1222 receives and processes a respective symbol stream to provide one or more analog signals, and further conditions (e.g., amplifies, filters, and upconverts) the analog signals to provide a modulated signal suitable for transmission over the MIMO channel. Further, $N_T$ modulated signals from transmitters 1222a through 1222t are transmitted from $N_T$ antennas 1224a through 1224t, respectively.

At access terminal 1250, the transmitted modulated signals are received by $N_R$ antennas 1252a through 1252r and the received signal from each antenna 1252 is provided to a respective receiver (RCVR) 1254a through 1254r. Each receiver 1254 conditions (e.g., filters, amplifies, and downconverts) a respective signal, digitizes the conditioned signal to provide samples, and further processes the samples to provide a corresponding "received" symbol stream.

An RX data processor 1260 can receive and process the $N_R$ received symbol streams from $N_R$ receivers 1254 based on a particular receiver processing technique to provide $N_T$ "detected" symbol streams. RX data processor 1260 can demodulate, deinterleave, and decode each detected symbol stream to recover the traffic data for the data stream. The processing by RX data processor 1260 is complementary to that performed by TX MIMO processor 1220 and TX data processor 1214 at base station 1210.

A processor 1270 can periodically determine which available technology to utilize as discussed above. Further, processor 1270 can formulate a reverse link message comprising a matrix index portion and a rank value portion.

The reverse link message can comprise various types of information regarding the communication link and/or the received data stream. The reverse link message can be processed by a TX data processor 1238, which also receives traffic data for a number of data streams from a data source 1236, modulated by a modulator 1280, conditioned by transmitters 1254a through 1254r, and transmitted back to base station 1210.

At base station 1210, the modulated signals from access terminal 1250 are received by antennas 1224, conditioned by receivers 1222, demodulated by a demodulator 1240, and processed by a RX data processor 1242 to extract the reverse link message transmitted by access terminal 1250. Further, processor 1230 can process the extracted message to determine which precoding matrix to use for determining the beamforming weights.

Processors 1230 and 1270 can direct (e.g., control, coordinate, manage, etc.) operation at base station 1210 and access terminal 1250, respectively. Respective processors 1230 and 1270 can be associated with memory 1232 and 1272 that store program codes and data. Processors 1230 and 1270 can also perform computations to derive frequency and impulse response estimates for the uplink and downlink, respectively.

In an aspect, logical channels are classified into Control Channels and Traffic Channels. Logical Control Channels can include a Broadcast Control Channel (BCCH), which is a DL channel for broadcasting system control information. Further, Logical Control Channels can include a Paging Control Channel (PCCH), which is a DL channel that transfers paging information. Moreover, the Logical Control Channels can comprise a Multicast Control Channel (MCCH), which is a Point-to-multipoint DL channel used for transmitting Multimedia Broadcast and Multicast Service (MBMS) scheduling and control information for one or several MTCHs. Generally, after establishing a Radio Resource Control (RRC) connection, this channel is only used by UEs that receive MBMS (e.g., old MCCH+MSCH). Additionally, the Logical Control Channels can include a Dedicated Control Channel (DCCH), which is a Point-to-point bi-directional channel that transmits dedicated control information and can be used by UEs having a RRC connection. In an aspect, the Logical Traffic Channels can comprise a Dedicated Traffic Channel (DTCH), which is a Point-to-point bi-directional channel dedicated to one UE for the transfer of user information. Also, the Logical Traffic Channels can include a Multicast Traffic Channel (MTCH) for Point-to-multipoint DL channel for transmitting traffic data.

In an aspect, Transport Channels are classified into DL and UL. DL Transport Channels comprise a Broadcast Channel (BCH), a Downlink Shared Data Channel (DL-SDCH) and a Paging Channel (PCH). The PCH can support UE power saving (e.g., Discontinuous Reception (DRX) cycle can be indicated by the network to the UE, . . . ) by being broadcasted over an entire cell and being mapped to Physical layer (PHY) resources that can be used for other control/traffic channels. The UL Transport Channels can comprise a Random Access Channel (RACH), a Request Channel (REQCH), a Uplink Shared Data Channel (UL-SDCH) and a plurality of PHY channels.

The PHY channels can include a set of DL channels and UL channels. For example, the DL PHY channels can include: Common Pilot Channel (CPICH); Synchronization Channel (SCH); Common Control Channel (CCCH); Shared DL Control Channel (SDCCH); Multicast Control Channel (MCCH); Shared UL Assignment Channel (SUACH); Acknowledgement Channel (ACKCH); DL Physical Shared Data Channel (DL-PSDCH); UL Power Control Channel (UPCCH); Paging Indicator Channel (PICH); and/or Load Indicator Channel (LICH). By way of further illustration, the UL PHY Channels can include: Physical Random Access Channel (PRACH); Channel Quality Indicator Channel (CQICH); Acknowledgement Channel (ACKCH); Antenna Subset Indicator Channel (ASICH); Shared Request Channel (SREQCH); UL Physical Shared Data Channel (UL-PSDCH); and/or Broadband Pilot Channel (BPICH).

It is to be understood that the embodiments described herein can be implemented in hardware, software, firmware, middleware, microcode, or any combination thereof. For a hardware implementation, the processing units can be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof.

When the embodiments are implemented in software, firmware, middleware or microcode, program code or code segments, they can be stored in a machine-readable medium, such as a storage component. A code segment can represent a procedure, a function, a subprogram, a program, a routine, a subroutine, a module, a software package, a class, or any combination of instructions, data structures, or program statements. A code segment can be coupled to another code segment or a hardware circuit by passing and/or receiving information, data, arguments, parameters, or memory contents. Information, arguments, parameters, data, etc. can be passed, forwarded, or transmitted using any suitable means including memory sharing, message passing, token passing, network transmission, etc.

For a software implementation, the techniques described herein can be implemented with modules (e.g., procedures, functions, and so on) that perform the functions described herein. The software codes can be stored in memory units and executed by processors. The memory unit can be implemented within the processor or external to the processor, in which case it can be communicatively coupled to the processor via various means as is known in the art.

Figure 13:
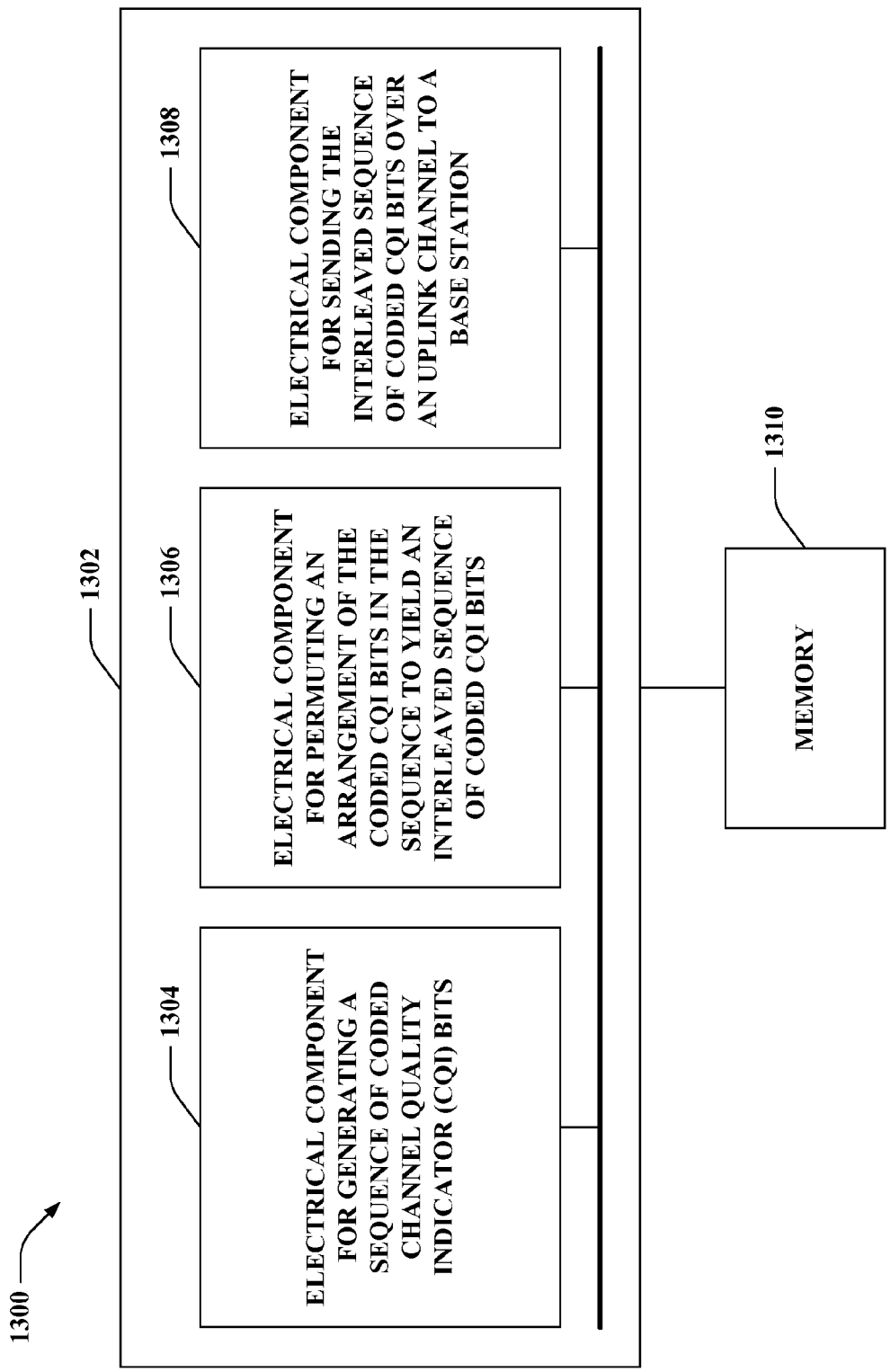
FIG. 13 is an illustration of an example system that enables sending Channel Quality Indicator (CQI) information in a wireless communication environment.

With reference to FIG. 13, illustrated is a system 1300 that enables sending Channel Quality Indicator (CQI) information in a wireless communication environment. For example, system 1300 can reside within an access terminal. It is to be appreciated that system 1300 is represented as including functional blocks, which can be functional blocks that represent functions implemented by a processor, software, or combination thereof (e.g., firmware). System 1300 includes a logical grouping 1302 of electrical components that can act in conjunction. For instance, logical grouping 1302 can include an electrical component for generating a sequence of coded Channel Quality Indicator (CQI) bits 1304. Further, logical grouping 1302 can include an electrical component for permuting an arrangement of the coded CQI bits in the sequence to yield an interleaved sequence of coded CQI bits 1306. Moreover, logical grouping 1302 can include an electrical component for sending the interleaved sequence of coded CQI bits over an uplink channel to a base station 1308. Additionally, system 1300 can include a memory 1310 that retains instructions for executing functions associated with electrical components 1304, 1306, and 1308. While shown as being external to memory 1310, it is to be understood that one or more of electrical components 1304, 1306, and 1308 can exist within memory 1310.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method that facilitates sending Channel Quality Indicator (CQI) information in a wireless communication environment, comprising:

encoding CQI information using a punctured Reed Muller block code to yield a sequence of coded CQI bits with a particular order;

interleaving the coded CQI bits to reorder the sequence of coded CQI bits, the interleaving comprising prime number based interleaving, generalized bit reversal interleaving, column-row interleaving with column bit reversal, and/or M-sequence based interleaving; and transmitting the reordered sequence of coded CQI bits to a base station via an uplink channel, wherein the prime number based interleaving comprises at least, in part, multiplying a respective input position, K, corresponding to one of the coded CQI bits in the sequence by a prime number, Q, to yield a respective product, wherein the generalized bit reversal interleaving comprises at least, in part, decomposing a total number of coded CQI bits, M, into prime factors, and wherein the column-row interleaving comprises at least, in part, decomposing the total number of coded CQI bits, M, into X groups, each group including Y coded CQI bits, wherein a product of X and Y equals M.

2. The method of claim 1, wherein each of the coded CQI bits is associated with a respective input position, K, in the sequence and a respective output position in the reordered sequence.

3. The method of claim 2, wherein a one-to-one mapping between input positions and output positions is leveraged.

4. The method of claim 1, wherein prime number based interleaving further comprises:
identifying a respective output position, K1, pertaining to a particular one of the coded CQI bits in the reordered sequence as being the respective product modulo the total number of coded CQI bits, M.

5. The method of claim 1, wherein generalized bit reversal interleaving further comprises:
representing a respective input position, K, corresponding to a particular one of the coded CQI bits in the sequence with an alphabet defined by prime factor decomposition of M to yield a representation;
bit reversing the representation of the respective input position, K, to generate a bit reversed representation; and
reading out the bit reversed representation to yield a corresponding output position, K2, corresponding to the particular one of the coded CQI bits in the reordered sequence.

6. The method of claim 1, wherein column-row interleaving with column bit reversal further comprises:
applying bit reversal to respective input positions, K, corresponding to the coded CQI bits in each of the X groups by swapping $\log_2(Y)$ least significant bits in each binary representation corresponding to each of the respective input positions, K;
inserting each of the X groups with bit reversed input positions into a corresponding, unique row of a matrix; and
reading column by column from the matrix to yield output positions for each of the coded CQI bits in the reordered sequence.

7. The method of claim 1, wherein interleaving using M-sequence based interleaving comprises at least, in part, transforming columns from a Hadamard matrix to M-sequences with common row permutation.

8. A wireless communications apparatus, comprising:
a memory that retains instructions related to:
applying a punctured Reed Muller block code to encode a Channel Quality Indicator (CQI) report to generate an uninterleaved sequence that includes M coded CQI bits in an input order, wherein M is an integer pertaining to a total number of coded CQI bits,
permuting the M coded CQI bits to yield an interleaved sequence that includes the M coded CQI bits in an output order, the permuting comprising prime number based interleaving, generalized bit reversal interleaving, column-row interleaving with column bit reversal, and/or M-sequence based interleaving, and
sending the interleaved sequence that includes the M coded CQI bits in the output order to a base station over an uplink channel; and a processor, coupled to the memory, configured to execute the instructions retained in the memory, wherein the prime number based interleaving comprises at least, in part, multiplying a respective input position, K, corresponding to one of the coded CQI bits in the sequence by a prime number, Q, to yield a respective product, wherein the generalized bit reversal interleaving comprises at least, in part, decomposing a total number of coded CQI bits, M, into prime factors, and wherein the column-row interleaving comprises at least, in part, decomposing the total number of coded CQI bits, M, into X groups, each group including Y coded CQI bits, wherein a product of X and Y equals M.

9. The wireless communications apparatus of claim 8, wherein each of the M coded CQI bits is associated with a respective input position in the uninterleaved sequence and a respective output position in the interleaved sequence.

10. The wireless communications apparatus of claim 8, wherein the prime number based interleaving further comprises recognizing a respective output position, K1, corresponding to a particular one of the M coded CQI bits in the interleaved sequence as being the respective product modulo M.

11. The wireless communications apparatus of claim 8, wherein the generalized bit reversal interleaving further comprises:
representing a respective input position, K, corresponding to a particular one of the M coded CQI bits in the uninterleaved sequence with an alphabet set forth by the prime factor decomposition to yield a representation,
bit reversing the representation of the respective input position, K, to generate a bit reversed representation, and
identifying a corresponding output position, K2, corresponding to the particular one of the M coded CQI bits in the interleaved sequence by converting the bit reversed representation.

12. The wireless communications apparatus of claim 8, wherein the column-row interleaving further comprises:
swapping $\log_2(Y)$ least significant bits in each binary representation corresponding to each respective input position, K, related to a corresponding one of the M coded CQI bits in each of the X groups,
inserting each of the X groups with swapped least significant bits into a corresponding, unique row of a matrix, and
reading column by column from the matrix to generate output positions for each of the M coded CQI bits in the interleaved sequence.

13. A wireless communications apparatus that enables sending Channel Quality Indicator (CQI) information in a wireless communication environment, comprising:
means for generating a sequence of coded CQI bits using a punctured Reed Muller block code;
means for permuting an arrangement of the coded CQI bits to yield an interleaved sequence of coded CQI bits by prime number based interleaving, generalized bit reversal interleaving, column-row interleaving with column bit reversal, and/or M-sequence based interleaving; and
means for sending the interleaved sequence of coded CQI bits over an uplink channel to a base station,
wherein the prime number based interleaving comprises at least, in part, multiplying a respective input position, K, corresponding to one of the coded CQI bits in the sequence by a prime number, Q, to yield a respective product, wherein the generalized bit reversal interleaving comprises at least, in part, decomposing a total number of coded CQI bits, M, into prime factors, and wherein the column-row interleaving comprises at least, in part, decomposing the total number of coded CQI bits, M, into X groups, each group including Y coded CQI bits, wherein a product of X and Y equals M.

14. The wireless communications apparatus of claim 13, wherein a one-to-one mapping between input positions in the sequence and output positions in the interleaved sequence for each of the coded CQI bits is leveraged.

15. A computer program product, comprising:
a computer-readable medium comprising:
code for applying a punctured Reed Muller block code to encode control channel information to generate an uninterleaved sequence that includes M coded bits in an input order, wherein M is an integer pertaining to a total number of coded bits;
code for permuting the M coded bits to yield an interleaved sequence that includes the M coded bits in an output order by prime number based interleaving, generalized bit reversal interleaving, column-row interleaving with column bit reversal, and/or M-sequence based interleaving; and
code for transmitting the interleaved sequence that includes the M coded bits in the output order to a base station over an uplink channel,
wherein the prime number based interleaving comprises at least, in part, multiplying a respective input position, K, corresponding to one of the coded CQI bits in the sequence by a prime number, Q, to yield a respective product,
wherein the generalized bit reversal interleaving comprises at least, in part, decomposing a total number of coded CQI bits, M, into prime factors, and
wherein the column-row interleaving comprises at least, in part, decomposing the total number of coded CQI bits, M, into X groups, each group including Y coded CQI bits, wherein a product of X and Y equals M.

16. The computer program product of claim 15, wherein the prime number based interleaving further comprises recognizing a respective output position, K1, corresponding to a particular one of the M coded bits in the interleaved sequence as being the respective product modulo M.

17. The computer program product of claim 15, wherein the generalized bit reversal interleaving further comprises:

representing a respective input position, K, corresponding to a particular one of the M coded bits in the uninterleaved sequence with an alphabet set forth by the prime factor decomposition to yield a representation, bit reversing the representation of the respective input position, K, to generate a bit reversed representation, and identifying a corresponding output position, K2, corresponding to the particular one of the M coded bits in the interleaved sequence by converting the bit reversed representation.

18. The computer program product of claim 15, wherein the column-row interleaving further comprises:
swapping $\log_2(Y)$ least significant bits in each binary representation corresponding to each respective input position, K, related to a corresponding one of the M coded bits in each of the X groups,
inserting each of the X groups with swapped least significant bits into a corresponding, unique row of a matrix, and
reading column by column from the matrix to generate output positions for each of the M coded CQI bits in the interleaved sequence.

19. A wireless communications apparatus, comprising:
a processor configured to:
encode Channel Quality Indictor (CQI) information using a punctured Reed Muller block code to yield a sequence of coded CQI bits with a particular order;
interleave the coded CQI bits to reorder the sequence of coded CQI bits by prime number based interleaving, generalized bit reversal interleaving, column-row interleaving with column bit reversal, and/or M-sequence based interleaving; and
transmit the reordered sequence of coded CQI bits to a base station via an uplink channel,
wherein the prime number based interleaving comprises at least, in part, multiplying a respective input position, K, corresponding to one of the coded CQI bits in the sequence by a prime number, Q, to yield a respective product,
wherein the generalized bit reversal interleaving comprises at least, in part, decomposing a total number of coded CQI bits, M, into prime factors, and
wherein the column-row interleaving comprises at least, in part, decomposing the total number of coded CQI bits, M, into X groups, each group including Y coded CQI bits, wherein a product of X and Y equals M.

* * * * *